(12) United States Patent
Toda

(10) Patent No.: US 7,006,380 B2
(45) Date of Patent: *Feb. 28, 2006

(54) NON-VOLATILE SEMICONDUCTOR MEMORY DEVICE READING AND WRITING MULTI-VALUE DATA FROM AND INTO PAIR-CELL

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/012,226

(22) Filed: Dec. 16, 2004

(65) Prior Publication Data

US 2005/0099848 A1   May 12, 2005

Related U.S. Application Data

(63) Continuation of application No. 10/461,398, filed on Jun. 16, 2003, now Pat. No. 6,847,555.

(30) Foreign Application Priority Data

Apr. 16, 2003   (JP) .............................. 2003-111960

(51) Int. Cl.
*G11C 16/28* (2006.01)

(52) U.S. Cl. ..................... 365/185.21; 365/185.17; 365/185.03; 365/185.22; 365/185.11

(58) Field of Classification Search ........... 365/185.17, 365/185.03, 185.21, 185.22, 185.2, 185.11, 365/185.33

See application file for complete search history.

(56) References Cited

U.S. PATENT DOCUMENTS

| 5,208,771 | A | 5/1993 | Shikata ........................ 365/154 |
| 5,844,841 | A | 12/1998 | Takeuchi et al. ........ 365/185.03 |
| 6,525,979 | B1 * | 2/2003 | Kato .......................... 365/210 |
| 6,639,862 | B1 | 10/2003 | Spirkl ........................ 365/222 |
| 6,738,282 | B1 | 5/2004 | Jo ............................... 365/149 |
| 6,847,555 | B1 * | 1/2005 | Toda ...................... 365/185.21 |

* cited by examiner

*Primary Examiner*—Andrew Q. Tran
(74) *Attorney, Agent, or Firm*—Oblon, Spivak, McClelland, Maier & Neustadt, P.C.

(57) ABSTRACT

A non-volatile semiconductor memory device includes: a memory cell array in which a plurality of electrically rewritable and non-volatile memory cells are arranged; a sense amplifier circuit configured to write M-value data (where, M is an integer equal to 4 or more) to pair-cells each constituted by simultaneously selected first and second memory cells connected to a pair of bit lines in the memory cell array, the M-value data being defined as a combination of different threshold levels of the first and second memory cells in M threshold levels to be set at each memory cell, and read M-value data stored in each pair-cell by sensing a difference between cell currents of the first and second memory cells; and a controller configured to control data write and read operations for the memory cell array.

18 Claims, 17 Drawing Sheets

NON-VOLATILE SEMICONDUCTOR MEMORY DEVICE READING AND WRITING MULTI-VALUE DATA FROM AND INTO PAIR-CELL

CROSS-REFERENCE TO RELATED APPLICATION

This application is based on and claims the benefit of priority from the prior Japanese Patent Application No. 2003-111960, filed on Apr. 16, 2003, and also claims the benefit of priority under 35 U.S.C. §120 to U.S. Ser. No. 10/461,398, filed Jun. 16, 2003 now U.S. Pat. No. 6,847,555, the entire contents of each are incorporated herein by reference.

BACKGROUND OF THE INVENTION

1. Field of the Invention

This invention relates to an electrically rewritable and non-volatile semiconductor memory device (EEPROM) and an electric device using the same.

2. Description of Related Art

EEPROM flash memories are roughly classified into two types, i.e., NAND-type and NOR-type. A NAND-type flash memory uses a NAND string (i.e., NAND cell unit) with plural cells serially connected as sharing sources and drains with the neighboring cells. Due to this fact, the NAND-type flash memory has a higher cell density than a NOR-type flash memory. In addition, since NAND-type flash memory is possible to be written into plural cells at a time by FN tunneling, power consumption thereof, is small. In consideration of these characteristics, the NAND-type flash memory is generally applied to a file memory with a large scale capacitance. On the other hand, NOR-type flash memory is characterized in that it is high-speed accessible, while the power consumption is large because hot electron injection is used for data writing. Therefore, the NOR-type flash memory is mainly applied to mobile devices.

However, recent mobile devices are going to treat image data and the like with large data quantities. Accordingly, it is required of a flash memory to have high-speed accessibility and a large capacitance like a file memory. As described above, a conventional NAND-type flash memory, cell current of which is small due to its NAND string structure, is not suitable for high-speed random accessing. To apply a NAND-type flash memory to a high-speed system with a buffer memory such as a DRAM or the like, such a method is used as, for example, to read out one page data to a page buffer, then serially transfer and output the read out data, thereby improving a data transmission rate.

Even if the above-described method is used, the performance improvement of the conventional NAND flash memory is limited. The reason of this can be said as follows. It is impossible to use a reference level for high-speed sensing because the cell current of the NAND-type flash memory is about $1/100$ to $1/10$ of that of the NOR-type flash memory. The sense amplifier used in the conventional NAND flash memory is configured to sense cell data by sensing whether the data charge in the latch is discharged or not in response to the on/off state of a selected cell. Therefore, it takes about a few or several micro seconds for data reading. In contrast to this, in the NOR-type flash memory, the cell dada read may be done in 10 to 100 [nsec].

One approach for increasing the cell current of the NAND-type flash memory is to make the cell size (i.e., channel width) large. However, this approach will dilute a property of the NAND-type flash memory as the unit cell area is small.

In a DRAM, it takes about 5 [nsec] for giving voltage difference of about 50 [mV] to a pair of bit lines with a capacitance of about 100 [fF] to sense it. The current amount in this case is about 1 [µA]. On the other hand, the cell current of the NAND flash memory is about 1 [µA]. Suppose that the cell array is formed with such a scale as the bit line capacitance is about 1 [pF], the cell data sensing may be done in about 50 [nsec]. In order to achieve the above-described data sensing time, it is necessary to use a bit line pair scheme, by which a static reference level is obtained, like the DRAM. However, it is required of a NAND-type flash memory to determine the cell data by use of the on-state and off-state. It is not practical to statically make a reference current with about a half of the on-cell current for each bit line pair.

It has already been provided to use a multi-value data storage scheme in order to make a flash memory able to store a large data quantity. It has also been provided a method for shortening read time by reducing the number of data read steps in a case that multi-value storage scheme is used (see, e.g., Published Unexamined Japanese Patent Application No. 2001-93288).

As described above, NAND-type and NOR-type flash memories are classified according to applications as follows: the former is used for applications in which large data quantity storing is required; and the latter for applications in which high-speed performance is required. In consideration of the above-described situation, recently, it is required to achieve a flash memory technique that is able to make the best use of the characteristics of both a NAND-type flash memory and a NOR-type flash memory.

SUMMARY OF THE INVENTION

A non-volatile semiconductor memory device according to one aspect of the present invention includes:
a memory cell array in which a plurality of electrically rewritable and non-volatile memory cells are arranged; and
a sense amplifier circuit configured to read data of the memory cell array, wherein
first and second memory cells selected simultaneously in the memory cell array constitute a pair-cell for storing multi-value data, the multi-value data being defined by a combination of different threshold levels of the first and second memory cells, and wherein
the sense amplifier circuit detects a difference between cell currents of the first and second memory cells to sense data of the pair-cell.

DETAILED DESCRIPTION OF THE EMBODIMENTS

Figure 1:
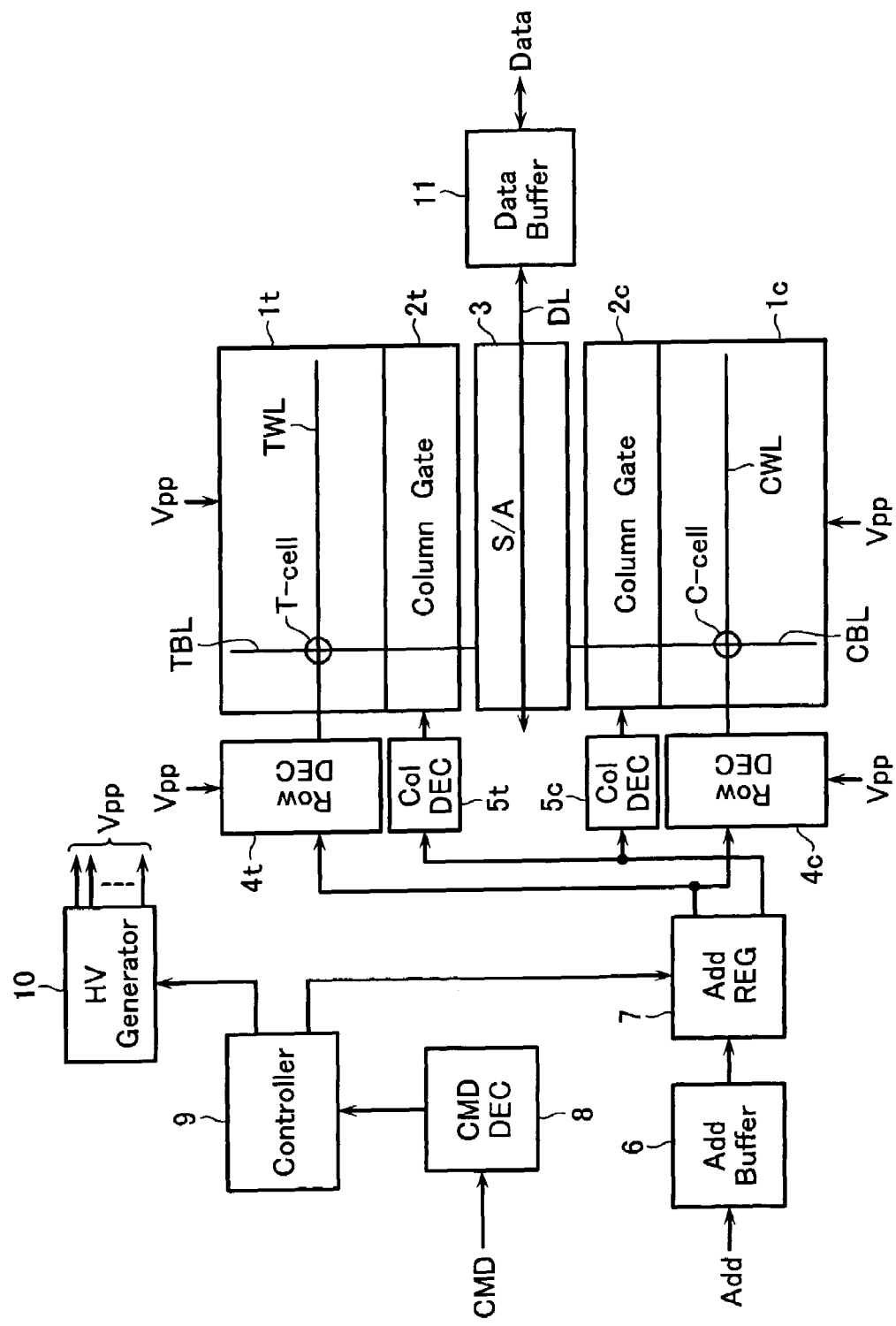
FIG. 1 shows a configuration of a NAND-type flash memory cording to an embodiment of the present invention.

Referring to the drawings, a NAND-type flash memory according to an embodiment will be described bellow. In the flash memory of this embodiment, a combination of a multi-value data storage scheme and a pair-cell scheme, in which two cells constitute a pair-cell for storing complementary data therein, is used. By use of the above-described combination of two schemes, it is able to achieve a NAND memory system with a high-speed performance while bit density thereof is maintained at a high level. That is, in the pair-cell scheme, data storage is performed by one-bit/two-cell. In this case, however, perform for example 4-value data storage for a pair-cell, and it results in a storage manner of one-bit/one-cell. Further, perform data determination by comparing two cell currents for each pair-cell, it becomes to be able to precisely read out data with a high-speed performance even if the cell current is small.

This invention may be generally applied to a memory in which one cell stores M-value data (where, M is an integer more than two) and a pair-cell stores N-value data (where, N=M(M-1) defined by a combination of different threshold levels of two cells in the pair-cell. For example, in case of M=4, the number of data states settable in one pair-cell is 12 (=4×3). However, in case one pair-cell is used to store more than 4-value data, the data read and write become to be complicated. Therefore, only 4-value data storage case will be described in this embodiment.

FIG. 1 shows a configuration of a NAND-type flash memory according to an embodiment. A memory cell array 1 is formed of two cell arrays 1t and 1c which share a sense amplifier circuit 3 with each other. The corresponding two bit lines, TBL and CBL, which are simultaneously selected, constitute a pair. That is, an open bit line scheme is used in this embodiment. Two memory cells (i.e., a true cell, T-cell, and a complementary cell, C-cell) selected by the two bit lines TBL, CBL and two word lines TWL, CWL, which are simultaneously selected from the cell arrays 1t, 1c respectively, constitute a pair-cell or "cell-pair" (complementary cells) for storing complementary data.

The reason of why the open-bit line scheme is used in this embodiment is in the fact that it is necessary, as described later, for applying different voltages to the word lines TWL, CWL simultaneously selected during data read and data write. The pair of bit lines TBL, CBL are selected by column gates 2t, 2c to be connected to the sense amplifier circuit 3, respectively. Data communication between a data line DL disposed in the sense amp circuit region and an external input/output terminal is performed via a data buffer 11.

The column gates 2t, 2c, which are disposed between the cell arrays 1t, 1c and the sense amplifier circuit 3, are controlled by column decoders 5t, 5c, respectively. The word lines of the cell arrays 1t, 1c are controlled by row decoders 4t, 4c, respectively. Address signals Add are supplied to the row decoders 4t, 4c and column decoders 5t, 5c via an address buffer 6 and an address register 7.

Command data CMD is decoded by a command decoder 8 to be supplied to a controller 9. The controller 9 is prepared to perform sequential controls for data read, write and erase. It is necessary to generate some kinds of high voltages Vpp (e.g., write pulse voltage Vpgm, verify voltage Vr, pass voltages Vpass, Vread and the like) which are to be supplied to cell arrays 1t, 1c and row decoders 4t, 4c corresponding to operation modes. A high voltage generation circuit 10 is controlled by the controller 9 to generate these high voltages Vpp.

Figure 2:
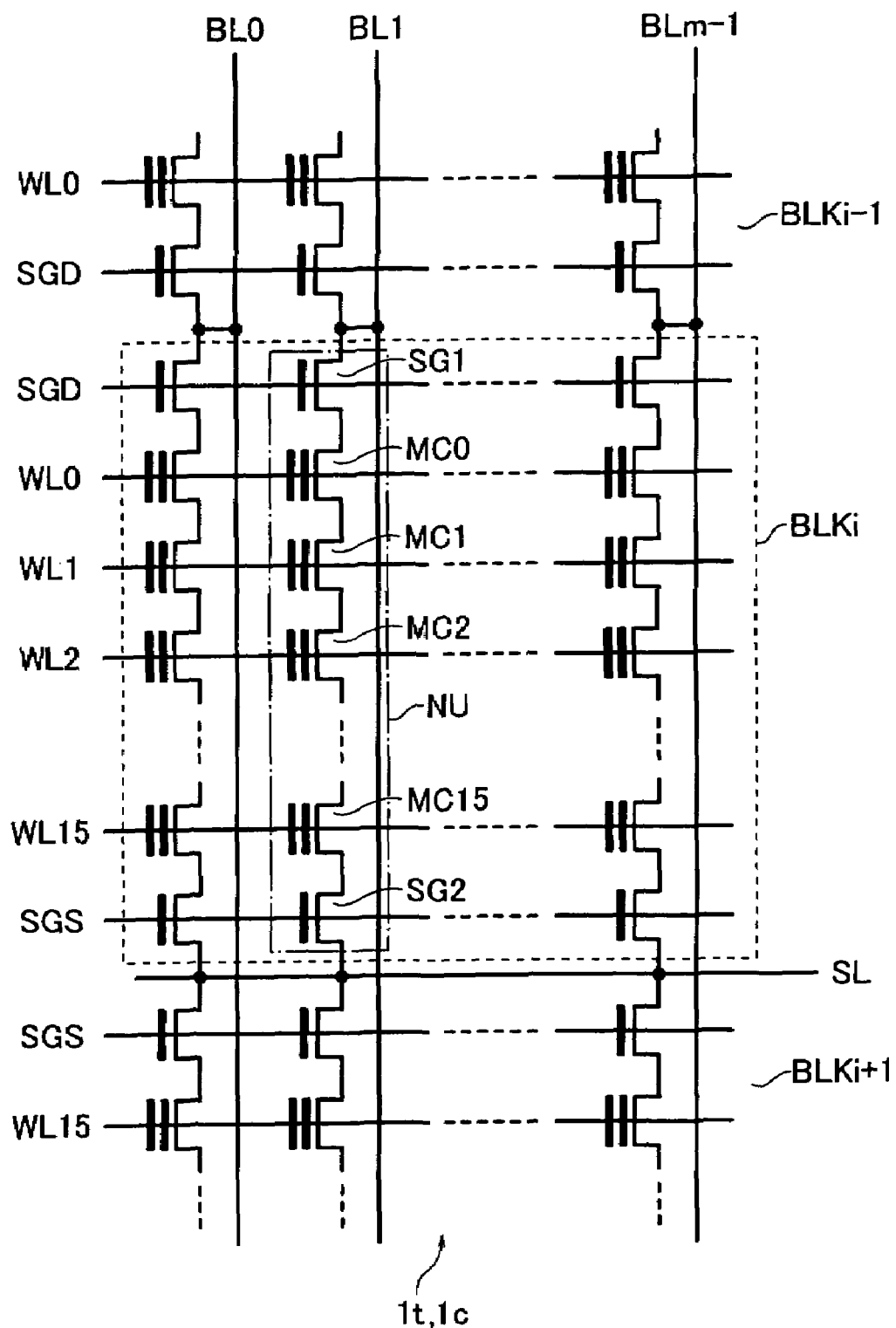
FIG. 2 shows a configuration of the memory cell array of the flash memory.

FIG. 2 shows an internal configuration of each cell array 1t, 1c. Memory cells MC are disposed at the respective crossing points of bit lines BL and word lines WL which are disposed as being crossed each other. Each memory cell MC has a MOS transistor structure with a floating gate and a control gate stacked thereabove, and stores data defined by a charge storage state on the floating gate. In this embodiment, sixteen memory cells MC0 to MC15 are serially connected to constitute a NAND string (i.e., NAND cell unit) NU. One end of the NAND cell unit NU is connected to bit line BL through a select gate transistor SG1, and the other to common source line SL through another select gate transistor SG2.

Control gates of the respective memory cells MC0 to MC15 are connected to word lines WL0 to WL15, respectively. Gates of the select gate transistors SG1, SG2 are connected to select gate lines SGD, SGS respectively, which are disposed in parallel with the word lines WL. Generally, a range of memory cells arranged along a word line WL makes up a page serving as a unit for data write and read. A range of plural NAND cell units arranged along word lines becomes a block BLKi serving as a unit for data erase at a time. A plurality of blocks are disposed in the direction of the bit lines BL generally. AS shown in FIG. 1, two memory cells, true cell T-cell and complementary cell C-cell, which are simultaneously selected from the cell arrays 1t, 1c, constitute a pair-cell.

Data read may be performed by detecting whether a precharged bit line is discharged or not by a selected cell. At this time, read voltage is applied to a selected word line, and pass voltages to the remaining word lines in a selected NAND cell unit. The pass voltage is set at a value that is able to turn on the cell in spite of its data state. Under the above-described conditions, it is determined according to the data state of the selected cell whether a discharge passage is formed or not from the bit line to the source line. Therefore, it is possible to sense data by detecting whether the bit line is discharged or not.

Figure 3:
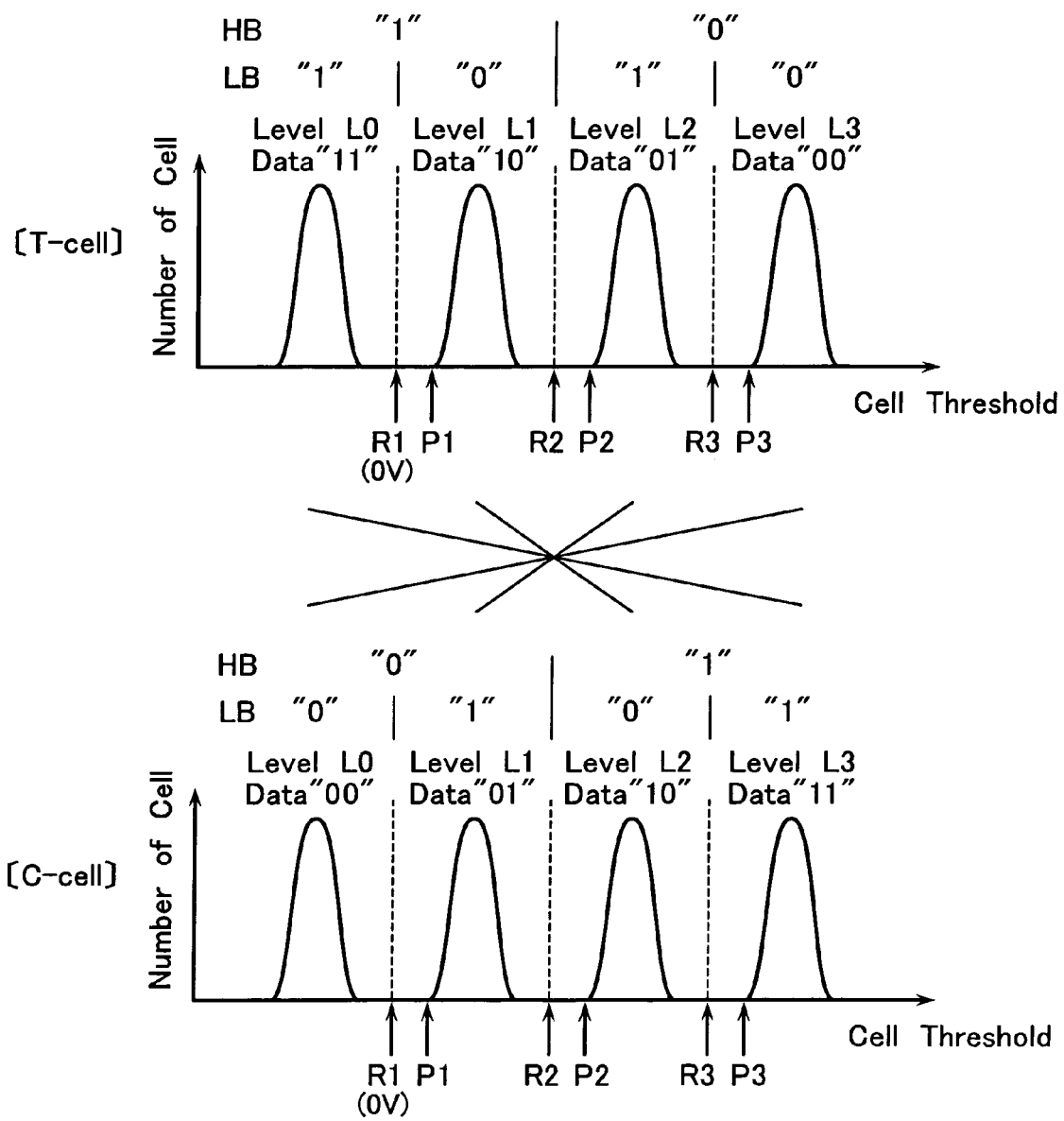
FIG. 3 shows data states stored in a pair-cell of the flash memory.

FIG. 3 shows threshold distributions showing relationships between the multi-value data and bit data thereof stored in the cells T-cell, C-cell constituting a pair-cell. In this embodiment, a memory cell stores 4-value data defined by four threshold levels L0, L1, L2 and L3 (where, L0<L1<L2<L3). The assignment of two bits of the 4-value data to the four threshold levels is, as shown in FIG. 3, determined as T-cell and C-cell store different threshold levels with each other.

In detail, referring to that 4-value data is expressed as "XY" with a higher bit (HB) "X" and a lower bit (LB) "Y", data "11", "10", "01" and "00" are assigned to the threshold levels L0, L1, L2 and L3 in T-cell, respectively. In T-cell, bit data "1" and "0" of the 4-value data correspond to an on-cell state (i.e. low threshold state) and an off-cell state (i.e. high threshold state), respectively, under the condition of that a predetermined read voltage is applied to it during data read. In C-cell, the relationship between the bit data and the threshold levels are determined as being contrary to that in T-cell. That is, when T-cell stores level L0, the corresponding C-cell stores level L3, and this combination of cell data serves as data "11". When T-cell stores level L1, the corresponding C-cell stores level L2, and this combination of cell data serves as data "10". When T-cell stores level L2, the corresponding C-cell stores level L1, and this combination of cell data serves as data "01". When T-cell stores level L3, the corresponding C-cell stores level L0, and this combination of cell data serves as data "00".

In FIG. 3, these complementary data composed of T-cell and C-cell are connected by straight lines. By use of such the 4-value data storage with two cells, the data density of 1-bit/1-cell may be substantially obtained. In FIG. 3, R1, R2 and R3 are read voltages applied to a selected word line for reading the respective 4-value data during data read. P1, P2 and P3 are verify-voltages applied to a selected word line for verify-reading the respective 4-value data in data write cycles.

Figure 4:
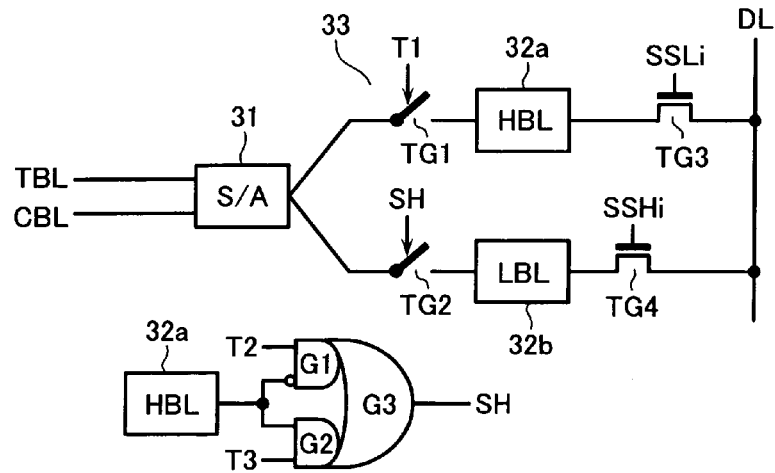
FIG. 4 shows a basic configuration of a data read circuit system in the sense amplifier circuit system of the flash memory.

Basic operations of data read and data write for the pair-cell composed of T-cell and C-cell will be described referring to FIG. 4. FIG. 4 shows a basic unit of the read circuit system of the sense amplifier circuit 3 by giving attention to a pair of bit lines TBL and CBL to be connected to cells T-cell and C-cell, respectively. A sense amplifier 31 connected to bit lines TBL, CBL is an active and current sensing-type differential sense amplifier for sensing and amplifying a difference of cell currents of the pair-cell which flow on the bit lines TBL, CBL. By use of the above-described current sensing-type differential sense amplifier 31, even if the cell current is small, it becomes to be able to perform high-speed data reading. According to the sensing scheme, so far as that the cell currents of data bits "1" and "0" are different from each other, it is possible to detect data without setting a reference level. As a result, static data storage and high-speed data read will not be influenced much by distortion of cell threshold, variations of cell characteristic and the like.

It is required to take three steps for reading the 4-value data. At a first step, judgment of whether each higher bit (HB) is "1" or "0" is performed for all pair-cells by use of the read voltage R2 set between the threshold voltages L1 and L2. At second and third steps, judgments of each lower bit (LB) are performed for the respective pair-cells with the higher bits (HB) as being "0" and "1", respectively. In detail, with respect to the pair-cells with the higher bit (HB) as being "0", apply the read voltages R3 set between the threshold voltages L2 and L3 to T-cell, and simultaneously apply the read voltage R1 set between the threshold voltages L0 and L1 to C-cell, thereby determining whether the lower bit (LB) is "1" or "0". With respect to the pair-cells with the higher bit (HB) as being "1", apply the read voltages R1 to T-cell, and simultaneously apply the read voltage R3 to C-cell, thereby determining whether the lower bit (LB) is "1" or "0".

To use the above-described read sequence, in addition to the sense amplifier 31, data latches 32a and 32b are prepared for storing the higher bit (HB) and the lower bit (LB) of the 4-value data, respectively. These data latches 32a, 32b are selectively connected to the sense amplifier 31 via a transfer circuit 33 including transfer gates TG1 and TG2 which are controlled by timing signals T1 and SH, respectively. The timing signal T1 is one for transferring a sensed result for determining the higher bit to the data latch 32a. As described above, it is necessary for reading by two steps. Timing signals T2 and T3 are ones used for these two steps. Corresponding to the higher bit previously read to the data latch 32a, one of the timing signals T2 and T3 becomes to be active. On receipt of the timing signals T2, T3 and the higher bit stored in the data larch 32a, a timing signal SH is generated to control the transfer gate TG2, thereby connecting the data latch 32b to the sense amplifier 31 via the transfer gate TG2.

Although three steps are used for reading 4-value data of the pair cell, as previously described, read data transferred to the data latch 32a, 32b may be independently accessed. That is, the higher bit (HB) read out to the respective data latch 32a at the first step is transferred to data bus DL via a transfer gate TG3 controlled by a transfer signal SSLi to be output to outside of the chip. During this data output operation, the lower bit (LB) is read out to the data latches 32b at the second and third steps. The read out lower bit is transferred to data bus DL via a transfer gate TG4 controlled by a transfer signal SSHi to be output to outside of the chip.

Figure 5:
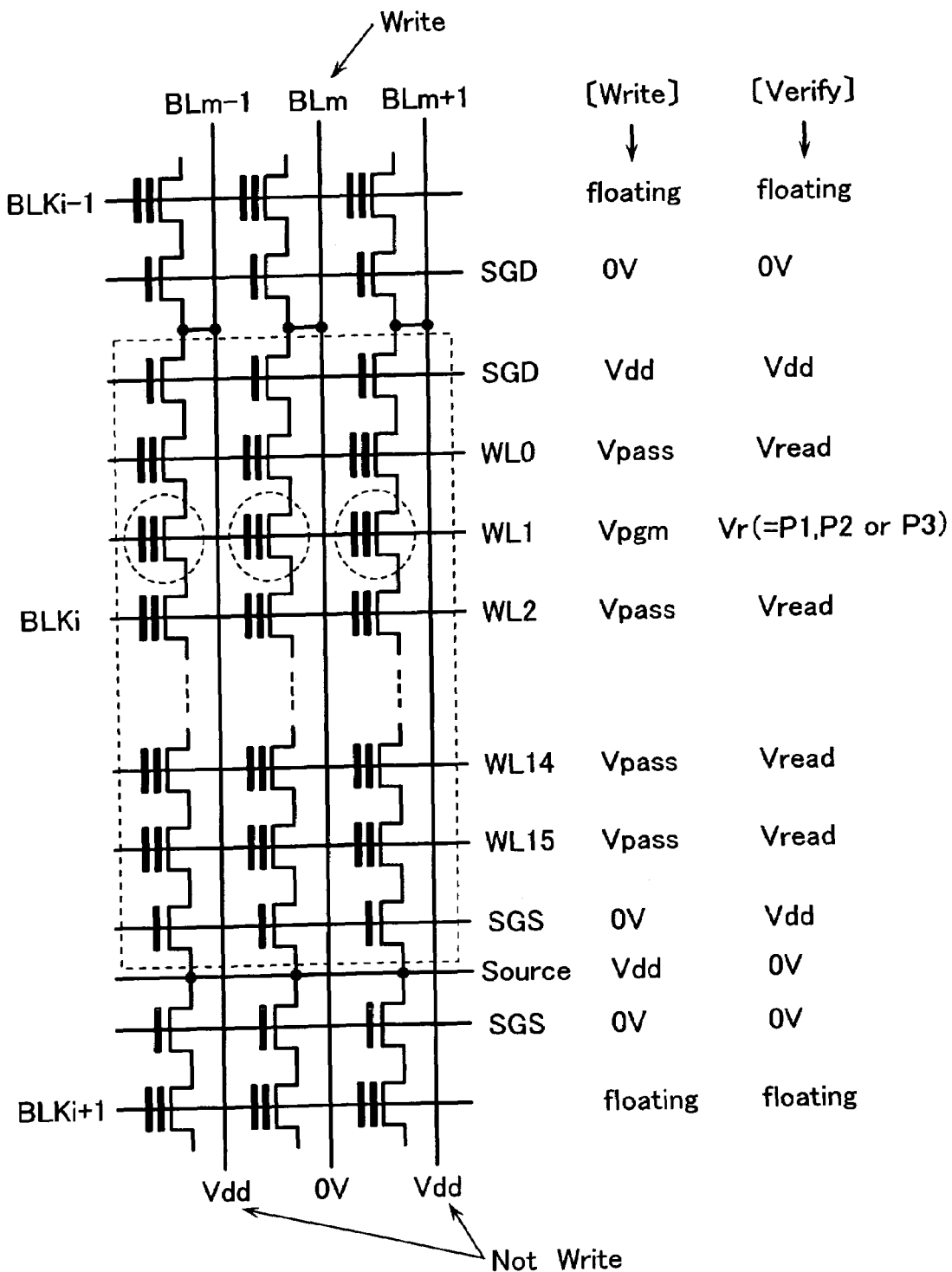
FIG. 5 shows a bias condition in the write cycle of the flash memory.

A data write operation will next be explained. FIG. 5 shows a bias condition in a data write cycle by giving attention to block BLKi. In this case, to a cell selected by word line WL1 and bit line BLm, writing for increasing the threshold (i.e., writing in the narrow sense) is performed. In other words, bit data "0" is written into T-cell, or bit data "1" is written into C-cell. This write operation is to inject electrons into the floating gate by FN tunneling, thereby increasing the cell threshold. For this purpose, a boosted write pulse voltage Vpgm is applied to the selected word line, and 0V is applied to the cell channel.

To non-selected word lines, a pass voltage Vpass is applied, which is able to turn on cells regardless of the cell data. To the select gate lines SGD and SGS disposed at bit line side and source line side, Vdd and 0V are applied, respectively. In order to set a low level to the channel of the NAND cell unit connected to the selected bit line BLm, 0V is applied to the bit line BLm. To bit lines BLm−1, BLm+1 connected to cells to be not written, vdd is applied. As a result, the floating gates of these cells are maintained at a floating state with a high level, whereby electron injection does not occur for the floating gates of these cells.

Figure 6:
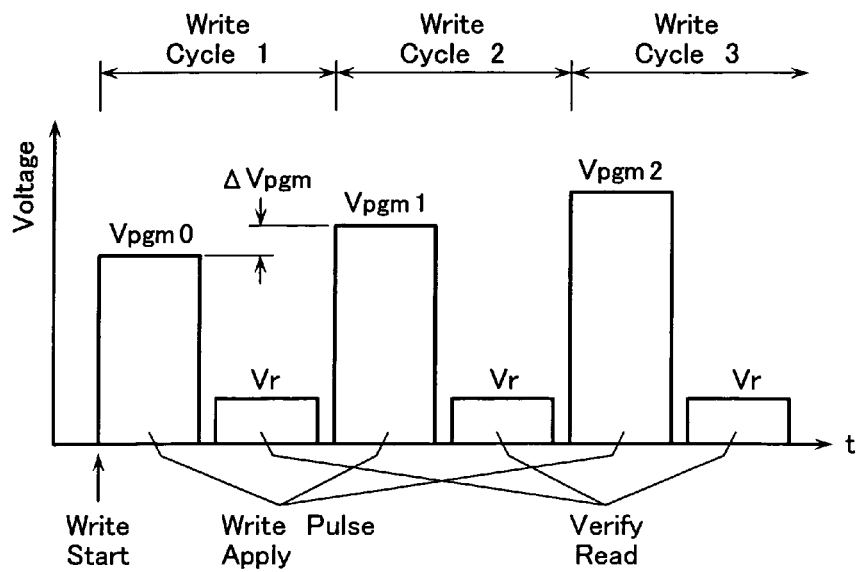
FIG. 6 is a diagram for explaining the write cycle of the flash memory.

In the data write operation, specifically in the multi-value data writing, it is required to make the threshold distribution as sharp as possible. For this purpose, a verify-read scheme is used. In detail, as shown in FIG. 6, write cycles, each of which includes a write pulse application operation and a verify-read operation thereafter, will be repeated. The write pulse voltage Vpgm is preferably stepped-up by ΔVpgm according to the write cycle advance. However, the above-described write pulse step-up scheme is not essential to data write. In place of the step-up scheme, another method for increasing the amount of injected electrons according to the write cycle advance may be used. This can be, for example, achieved by increasing the write pulse width as the number of write cycles increase.

Figure 7:
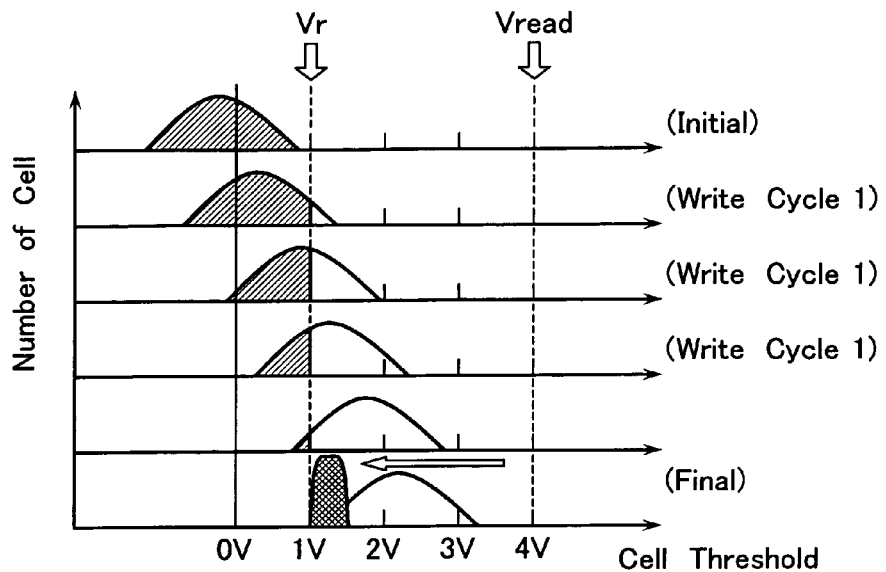
FIG. 7 shows threshold changes in the write operation of the flash memory.

As shown in FIG. 7, an initial state (i.e., erase state) of the threshold level L0 has a broad and normal distribution. Increase the cell threshold only by the write pulse application, and the threshold distribution will be shifted toward high level side as it is. In contrast to this, in the verify-write scheme, verify-read is performed by applying verify-voltage Vr to the selected word line for each write pulse voltage application, and after when a cell has been reached to have a threshold higher than or equal to the verify-voltage Vr, it is controlled to stop additional write operations for such the cell. By use of such the verify-write scheme, it is possible to obtain sharp threshold distribution states for written cells.

In FIG. 5, a bias condition in the verify-read mode also is shown. As the verify-read voltage Vr applied to the selected word line, one verify-voltage selected within P1, P2 and P3 will be used corresponding to what bit data is to be written. To the non-selected word lines, pass voltage Vread is applied, which turns on the cells regardless of the cell data.

By use of the above-described verify-write, when having written for all cells, the data state becomes to have a threshold distribution with a sharp peak near the verify-voltage Vr.

Figure 8:
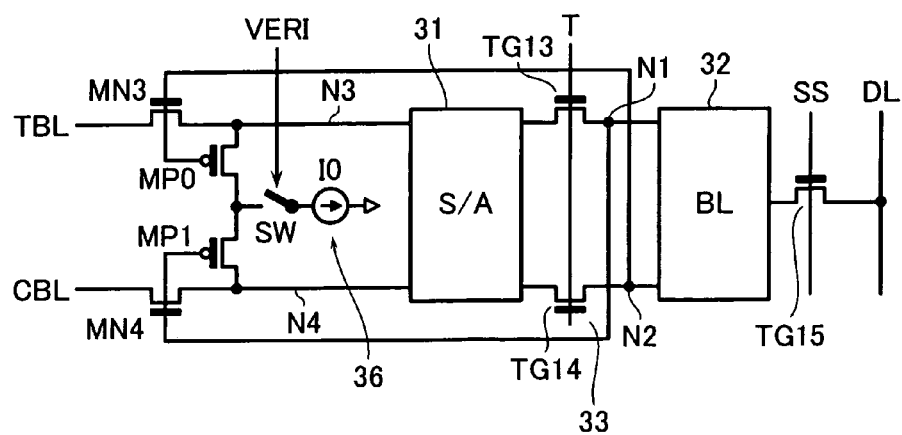
FIG. 8 shows a basic configuration of a dada write circuit system in the sense amplifier circuit of the flash memory.

FIG. 8 shows a basic unit of the write circuit system in the sense amplifier circuit 3 with respect to the bit lines TBL, CBL which are to be connected to cells T-cell, C-cell. A data latch 32 is a combination of the data latch 32a and 32b for the higher and lower bits. To the data latch 32, write data is loaded from the data bus DL via a transfer gate TG15 controlled by a transfer signal SS. The write data loaded at nodes N1, N2 of the data latch 32 is transferred to sense amplifier 31 via transfer gates TG13, TG14 controlled by a transfer signal T. Due to this data transfer, one of sense nodes N3 and N4, which are to be connected to bit lines TBL and CBL, is set at Vdd, and the other at 0V.

Disposed between the nodes N3, N4 and the bit lines TBL, CBL are transfer gate NMOS transistors MN3, MN4 gates of which are controlled by nodes N2, N1, respectively. For example, in a case that nodes N1 and N3 are set at "H", and nodes N2 and N4 are "L" corresponding to write data, NMOS transistors MN3 and MN4 become off and on, respectively. Note that bit lines TBL, CBL have been precharged at power supply voltage Vdd. When NMOS transistor MN4 becomes on due to the above-described write data transferring to the sense amplifier 31, the bit line CBL will be discharged to be 0V. Therefore, apply the write pulse voltage Vpgm to a selected word line, and a write condition is given to a selected cell, C-cell, connected to the bit line CBL as to cause the threshold to be increased. At this time, the bit line TBL is maintained in a floating state, and T-cell channel connected to the bit line TBL is also maintained in a floating state. Therefore, for this cell, T-cell, connected to bit line TBL, writing for increasing the threshold (i.e., writing in the narrow sense) will not be performed.

To judge the write operation end based on the verify-read, a reference current source circuit 36 is disposed. This reference current source circuit 36 is configured to flow current 10 smaller than that of the written cell, threshold of which has been increased to a predetermined level. The reference current source circuit 36 is selectively connected to sense node N3 or N4 via a switch SW controlled by a verify-judging signal VERI and PMOS transistors MP0, MP1. The PMOS transistors MP0, MP1 are gate-controlled by the nodes N2, N1 of the data latch 32, respectively. In the example of the above-described write data, i.e., N1="H", N2="L", PMOS transistor MP0 becomes on, thereby connecting the reference current source 10 to the node N3 during the verify-read.

The connection between the bit lines TBL, CBL and the sense nodes N3, N4 is, as above-described, automatically determined based on the write data held in the data latch 32. In the example of the above-described write data, NMOS transistor MN4 is on, whereby the bit line CBL is connected to node N4. That is, in the verify-read operation, only one of the bit line pair corresponding to a cell, into which threshold-increasing write operation has been done, is connected to the sense amplifier 31, and the verify-voltage is applied to the selected word line. As a result of this verify-read, if the threshold of the written cell has been set at a sufficiently high level, cell current thereof is smaller than the reference current 10. As a result, "H" and "L" at the sense nodes N3 and N4 become to be reversed. In other words, the data of the sense amplifier 31 is inverted in the logic level. Since then, additional write operations will not be performed for the written cells. For a cell threshold of which is not yet sufficiently increased, an additional write operation will be performed again in the next write cycle.

As described above, verify-reads and write pulse applications are repeated until all data of the sense amplifiers, which are selected to perform writing operation in the narrow sense, are inverted, and the entire data write cycles are finished by judging that all write data have been inverted in the sense amplifiers.

Figure 9:
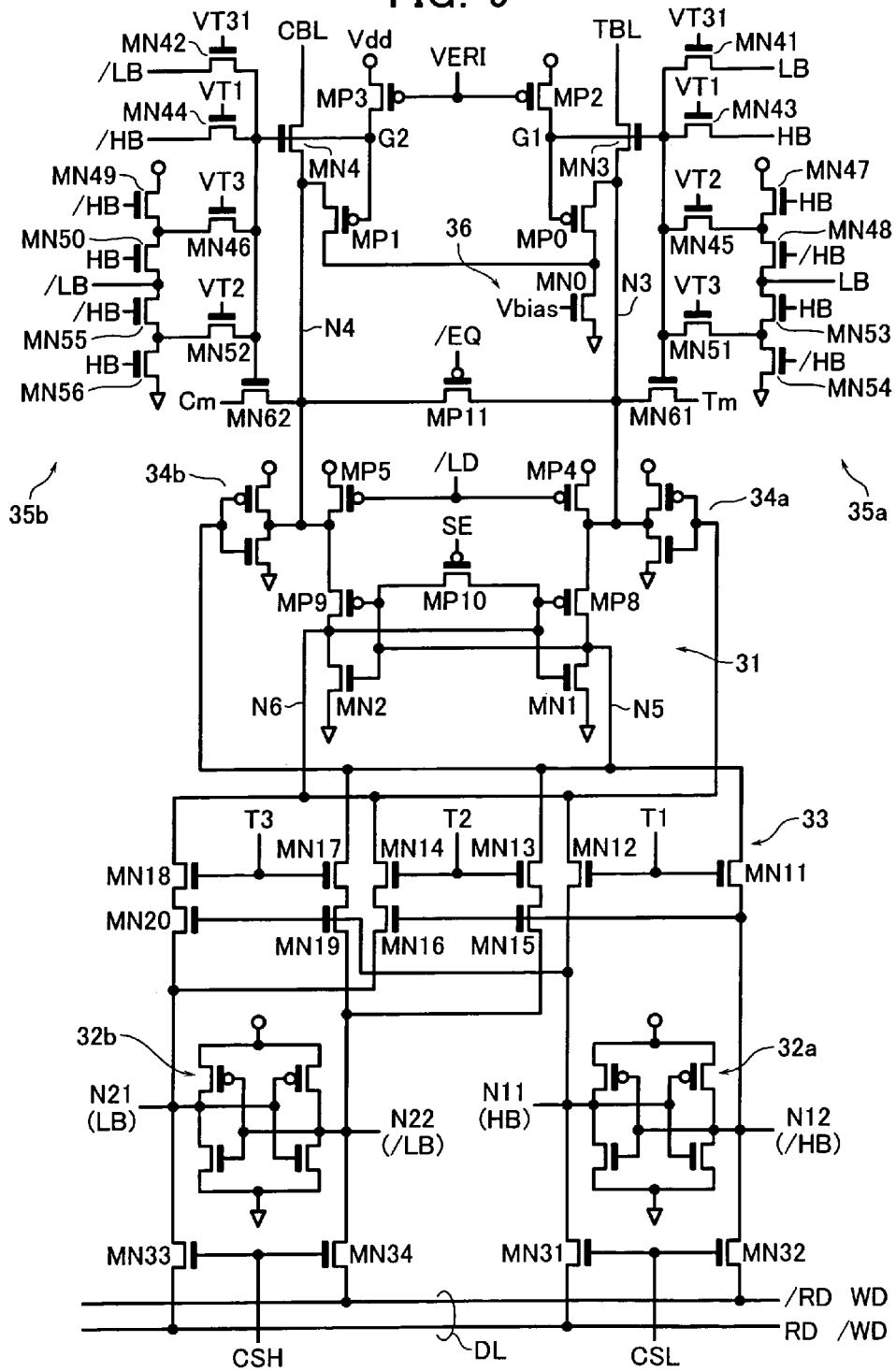
FIG. 9 shows a detailed configuration of the sense amplifier circuit of the flash memory.

FIG. 9 shows a detailed configuration of sense amplifier circuit 3 including the read circuit system shown in FIG. 4 and the write circuit system shown in FIG. 8. The differential sense amplifier 31 used for reading and writing is a CMOS flip-flop with PMOS transistors MP8, MP9, sources of which are connected to the sense nodes N3, N4 respectively, and NMOS transistors MN1, MN2 disposed between the drains of the PMOS transistors MP8, MP9 and a ground terminal. Nodes N5 and N6 of this flip-flop are to be shorted by a PMOS transistor M10 which is on when an activation signal SE is "L". Current source load PMOS transistors MP4, MP5 connected to the sense nodes N3, N4 are gate-driven by a control signal /LD to be on in an ordinary state. Further disposed between the sense nodes N3, N4 is an equalizing PMOS transistor MP11 which is controlled by an equalizing signal /EQ. In the ordinary state of /EQ="L", the equalizing transistor MP11 is on, whereby the nodes N3 and N4 are shorted.

The data latch 32 is composed of higher bit data latch (HBL) 32a and lower bit data latch (LBL) 32b. Nodes N11, N12 of the data latch 32a are connected to complementary read data lines RD, /RD in the data bus DL via NMOS transistors MN31, MN32, respectively, which are gate-controlled by a select signal CSL. In this embodiment, since read out data and write data are logically inverted each other, the complementary read data lines RD, /RD serve as complementary write data lines /WD, WD, respectively. Nodes N21, N22 of the data latch 32b are connected to complementary read data lines RD, /RD via NMOS transistors MN33, MN34, respectively, which are gate-controlled by a select signal CSH.

The transfer circuit 33 is controlled by timing signals T1, T2 and T3, which are used for the above-described three-step data read operations, and by the data held in the data latch 32a. In detail, the nodes N11, N12 of the data latch 32a are connected to the nodes N6, N5 through a transfer gate composed of NMOS transistors MN12, MN11 driven by the timing signal T1, respectively.

The nodes N21, N22 are connected to the nodes N6, N5 through a transfer gate composed of NMOS transistors MN16, MN15, MN14 and MN13, respectively. NMOS transistors MN16, MN15 become on when the data of the latch 32a is in a state of: N11="L", and N12="H". NMOS transistors MN14, MN13 are driven by the timing signal T2 to be on. The nodes N21, N22 are also connected to the nodes N6, N5 through another transfer gate composed of NMOS transistors MN20, MN19, MN18 and MN17, respectively. NMOS transistors MN20, MN19 become on when the data of the latch 32a is in a state as N11="H", and N12="L". NMOS transistors MN18, MN17 are driven by the timing signal T3 to be on. Note here that the timing signals T1, T2 and T3 are used not only in the data read operation, but also in the data write operation with three steps as described later.

In the data write mode, complementary bit data, which are to be transferred from the data latches 32a, 32b to the sense amplifier 31, are transferred to the sense nodes N3, N4 via inverters 34a, 34b. That is, one of the inverters 34a, 34b, to which "H" level is given, outputs "L". As a result, one of the nodes N3, N4, both of which have been precharged at Vdd, will be discharged to 0V.

The sense nodes N3, N4 are, as shown in FIG. 8, connected to a pair of bit lines TBL, CBL via the select gate NMOS transistors MN3, MN4. A reference current source circuit 36 is connected to the sense nodes N3, N4. This circuit 36 has a current source MNOS transistor MN0 which is selectively connected to sense nodes N3, N4 via PMOS transistors MP0, MP1. PMOS transistors MP0, MP1 and NMOS transistors MN3, MN4 have commonly connected gates G1, G2, respectively. NMOS transistor MN0 is gate-driven by a bias signal Vbias to flow a constant current I0.

One common gate G1 of transistors MN3, MP0 and the other common gate G2 of transistors MN4, MP1 are connected to a power supply terminal Vdd via PMOS transistors MP2 and MP3, respectively, which are controlled by a control signal VERI="L" in the data read mode and the data write mode. In the read mode and write mode, the bit lines TBL, CBL are connected to the sense nodes N3, N4 via the NMOS transistors MN3, MN4, respectively.

In the write mode, since when an initial write operation has been finished, the control signal VERI will become "H". During the sequential and repeated verify-read and rewriting operations, one of the NMOS transistors MN3 and MN4 is controlled to be on. That is, in the bit line pair of TBL and CBL, either bit line TBL or CBL is controlled to be connected to the sense amplifier 31, which is connected to a cell necessary for verifying after the write pulse application. The above-described on/off control of the NMOS transistors MN3, MN4 is done for each write-verify in the respective write cycles for the higher bit (HB) and lower bit (LB). To perform the above-described control, logic control circuits 35a, 35b are disposed so as to selectively give "H" level to the gates G1, G2 based on a combination logic of verify-use timing signals VT1–VT3, VT31, higher bit HB and lower bit LB. By use of the logic control circuits 35a, 35b, the select gate NMOS transistors MN3, MN4 may be controlled to either connect sense node N3 to bit line CBL or connect sense node N4 to bit line TBL.

Further, the sense nodes N3, N4 are connected to end-monitor nodes Tm, Cm via NMOS transistors MN61, MN62 respectively, which serve for judging that a write operation has been finished. These monitor nodes Tm, Cm are "L" in an initialized state. Gates of the NMOS transistors MN61, MN62 are connected to the gates G1, G2 of the transfer gate NMOS transistors MN3, MN4, respectively. Therefore, NMOS transistors MN61, MN62 are controlled simultaneously with NMOS transistors MN3, MN4 by the logic control circuits 35a, 35b. In a verify-read operation, one of the nodes N3, N4 becoming "H", which is connected to a bit line and to which data write has been completed, one of the monitor nodes Tm, Cm outputs "H".

Referring to the sense amplifier circuit, data read and write operations will be described in detail. As above-described, it is required of the data read and write operations to be performed by three-step timing control, and the data write operation includes periodically repeated write pulse applications and verify-reads. This sequence control may be done by the controller 9.

Figure 11:
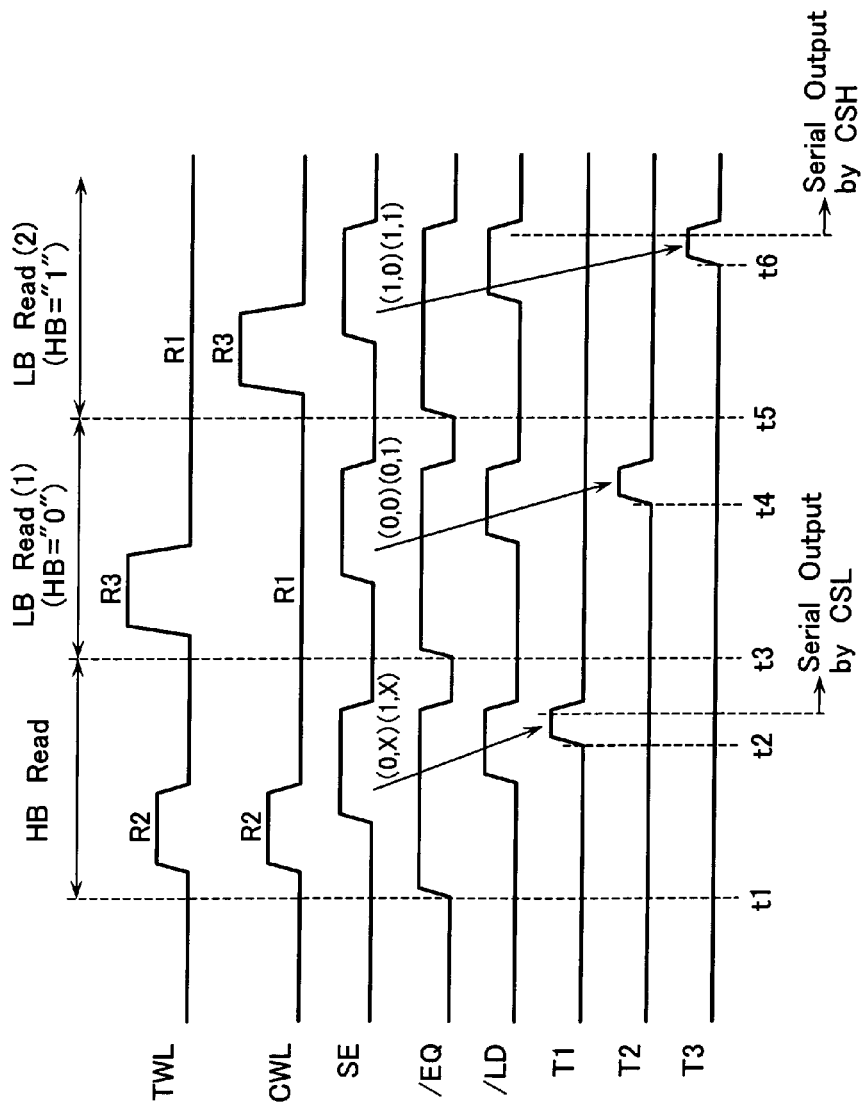
FIG. 11 is a timing chart for explaining the data read operation of the flash memory.

FIG. 11 shows a timing chart of a read operation. TWL, CWL are, as shown in FIG. 1, word lines simultaneously selected in the complementary cell arrays 1t, 1c. During the data read, all the control signal VERI and timing signals VT1–VT3, VT31 are set at "L". Therefore, on-state PMOS transistors MP2, MP3 give "H" to the gates G1, G2, whereby bit lines TBL, CBL are connected to the sense nodes N3, N4. This is a state possible to transfer selected pair-cell data to sense nodes N3, N4.

During the sense amplifier circuit is disable, activation signal SE, equalizing signal /EQ and precharging signal /LD are "L", whereby sense nodes N3, N4 and bit lines TBL, CBL are equalized to be at about Vdd level. Sense amp internal nodes N5, N6 are also equalized to have the same potential. Initially, to read higher bit HB, cancel the equalized state by /EQ="H" (at timing t1), and then apply higher bit read-use read voltage R2 to selected word lines TWL, CWL, as shown in FIG. 3. The read voltage R2 is set between the threshold levels L1 and L2. This is a read condition as to judge whether 4-value data is in a state of HB(X)="1" (data "11" or "10") or HB(X)="0" (data "01" or "00").

If the higher bit (HB) is "1", T-cell turns on. If the higher bit is "0", C-cell turns on. Let the activation signal SE be "H" for sensing the cell current difference between the bit lines TBL and CBL, and a potential difference is generated between the nodes N5 and N6 of the sense amplifier 31 corresponding to the cell current difference. The potential difference is fed-back to the bit lines TBL, CBL. After the potential difference having been sufficiently large, let the control signal /LD be "H", and the read out bit data of the sense amplifier 31 is decided.

After when the data sensing operation is started by the sense amplifier 31, it is permitted to pull down the potential of the word lines TWL, CWL. Then, the higher bit data defined in the sense amplifier 31 transferred to the data latch 32a via the NMOS transistors MN11, MN12 driven by the timing signal T1="H" (at timing t2), whereby the read step for the higher bit (HB) will be ended. After the higher bit (HB) having been transferred to the data latch 32a, let the select signal CSL be "H", and the read out higher bit data becomes accessible.

Next, equalize the pair of bit lines TBL, CBL to be initialized again, and then cancel the equalizing state (timing t3). Thereafter, apply the read voltage R3 to the word line TWL of the T-cell side, and simultaneously apply the read voltage R1 to the word line CWL of the C-cell side. As shown in FIG. 3, the read voltage R3 is set between the threshold levels L2 and L3; and the read voltage R1 is set between the threshold voltages L0 and L1. This is a read condition necessary for determining the lower bit LB in the case of the higher bit HB="0". Note a pair-cell of HB="0", T-cell is on in the case of LB="1", and C-cell is on in the case of LB="0". Therefore, perform data sense as similar to the higher bit read operation, and the lower bit (LB) is decided in the sense amplifier 31. For the case of HB="1", the lower bit state is not reflected in the decided data of the sense amplifier 31.

At timing t4, raise up the timing signal T2, and transfer the read out lower bit (LB) to the data latch 32b. For this data transfer, the higher bit (HB) held in the data latch 32a is used. That is, in the case of the higher bit HB="0" (i.e., HB="L" at node N11, and /HB="H" at node N12), NMOS transistors MN15 and MN16 turn on. Therefore, when NMOS transistors MN13 and MN14 turn on by the timing signal T2, the data held at the sense nodes N5, N6 is transferred to the data latch 32b. Up to this, the lower bit read operation for the case of HB="0" is ended.

Next, equalize the pair of bit lines TBL, CBL to be initialized again, and then cancel the equalizing state (timing t5). Thereafter, apply the read voltage R3 to the word line CWL of the C-cell side, and simultaneously apply the read voltage R1 to the word line TWL of the T-cell side. This is a read condition necessary for determining the lower bit LB in the case of the higher bit HB="1". Note a pair cell of HB="1", T-cell is on in the case of LB="1", and C-cell is on in the case of LB="0". Therefore, perform data sense as similar to the higher bit read operation, and the lower bit (LB) is decided in the sense amplifier 31. For the case of HB="0", the lower bit state is not reflected in the decided data of the sense amplifier 31.

At timing t6, raise up the timing signal T3, and transfer the read out lower bit (LB) to the data latch 32b. For this data transfer, the higher bit (HB) held in the data latch 32a is used as similar to the previously described lower bit transfer operation. That is, in the case of HB="1" (i.e., HB="H" at node N11, and /HB="L" at node N12), NMOS transistors MN19 and MN20 turn on. Therefore, when NMOS transistors MN17 and MN18 turn on by the timing signal T3, the data held at the sense nodes N5, N6 is transferred to the data latch 32b. Up to this, the lower bit read operation for the case of HB="1" is ended.

The above-described three-step data read having been performed, the data read sequence is ended. Hereinafter, raise up the transfer signal CSH, and the lower bit data held in the data latch 32b may be accessed.

Figure 10:
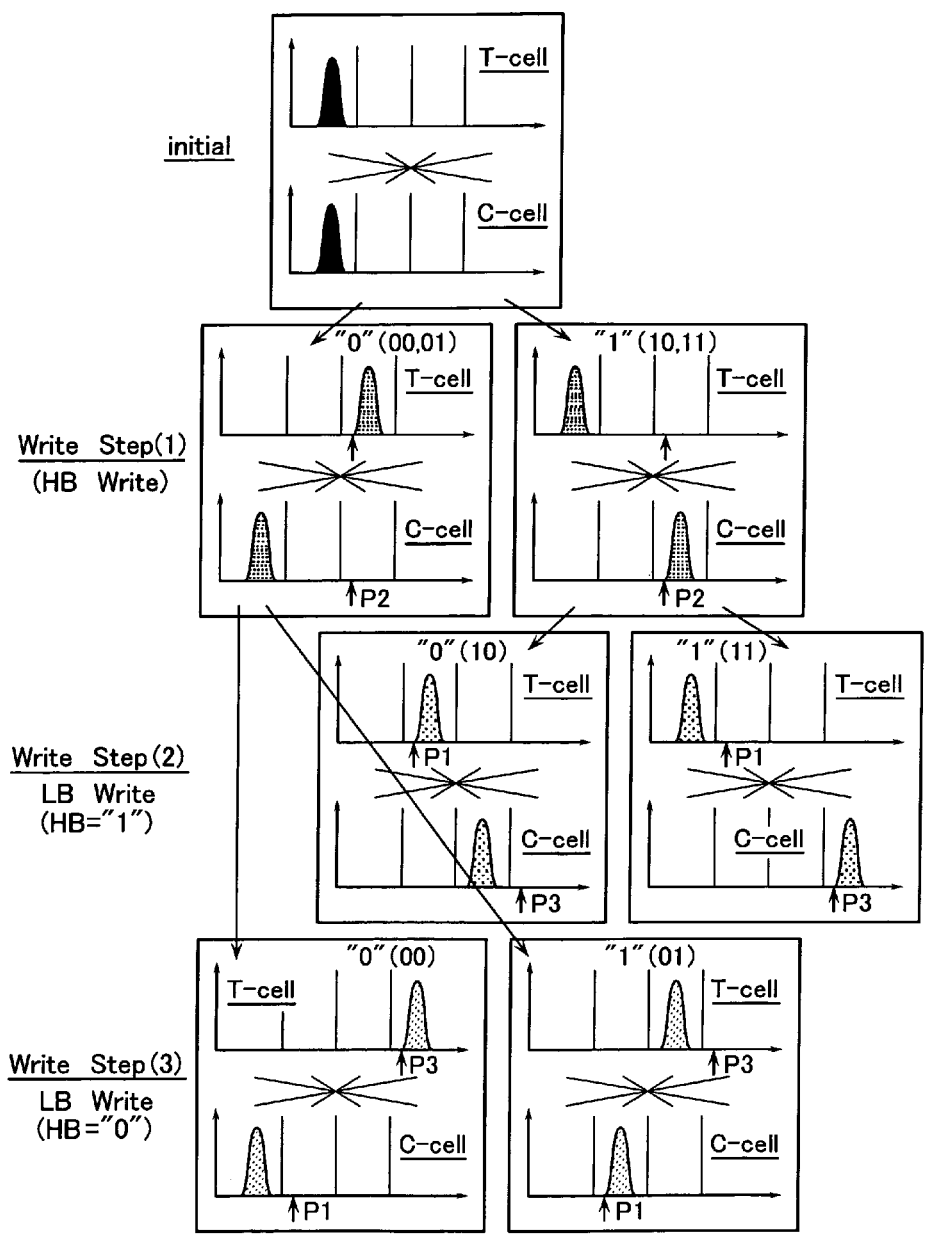
FIG. 10 shows a data write process of the flash memory.

A detailed data write operation will next be described. FIG. 10 shows a sequence of the data write operation with data states of a pair-cell composed of T-cell and C-cell. For data-writing, it is performed to erase all cell data in a to-be rewritten cell block at a time. This erase operation is done by applying a boosted erase voltage, Vera, to a well on which the cell block is formed, and 0V to all word lines in the cell block, thereby causing electrons held in all cells' floating gates to be released to the channel. As a result, all cells will be set at the lowest threshold state L0. The "initial" state shown in FIG. 10 is this erased state.

From this initial state, the data write operation will be performed with three steps. The sense amplifier circuit 3 is, for example, prepared to have sense amplifiers for 1-page data. 1-page data are loaded in the sense amplifier circuit 3, and then simultaneously written into 1-page cells. At a first write step (1), "0" and "1" of the higher bits HB are written. At this step (1), two kinds of write operations are performed for the pair-cells of 1-page as follows: for pair-cells that 4-value data with the higher bit, HB="0", are to be written, write threshold level L2 into T-cell, while C-cell is held at the threshold level L0; and for pair-cells that 4-value data with the higher bit, HB="1", are to be written, write threshold level L2 into C-cell, while T-cell is held at the threshold level L0. In this write step (1), verify-voltage P2 set between the threshold voltages L1 and L2 will be utilized. In this step, since the lower bit data is depressed, complementary data have not yet set into T-cell and C-cell of each pair cell.

At a second write step (2), for the respective pair cells in each of which the higher bit, HB="1", has been written, "0" and "1" of the lower bits LB are written as follows: write data "10" (threshold level L1) into T-cell in which the higher bit HB="1" has been written and the lower bit LB is to be "0"; and simultaneously write data "11" (threshold voltage L3) into C-cell in which the higher bit HB="1" has been written and the lower bit LB is to be "1". Therefore, at this write step (2), verify-voltages P1 and P3 are used. As a result of this write step (2), for T-cell, C-cell of each pair-cell with the higher bit, HB="1", the write data is decided.

At a third write step (3), for the respective pair cells in which the higher bits, HB="0", have been written, "0" and "1" of the lower bits LB are written as follows: write data "00" (threshold level L3) into T-cell in which the higher bit HB="0" has been written and the lower bit LB is to be "0"; and simultaneously write data "01" (threshold voltage L1) into C-cell in which the higher bit HB="0" has been written and the lower bit LB is to be "1". Therefore, in this write step (3), verify-voltages P1 and P3 are also used. As a result of this write step (3), for T-cell, C-cell of each pair cell having the higher bit, HB="0", the write data is decided.

Figure 12:
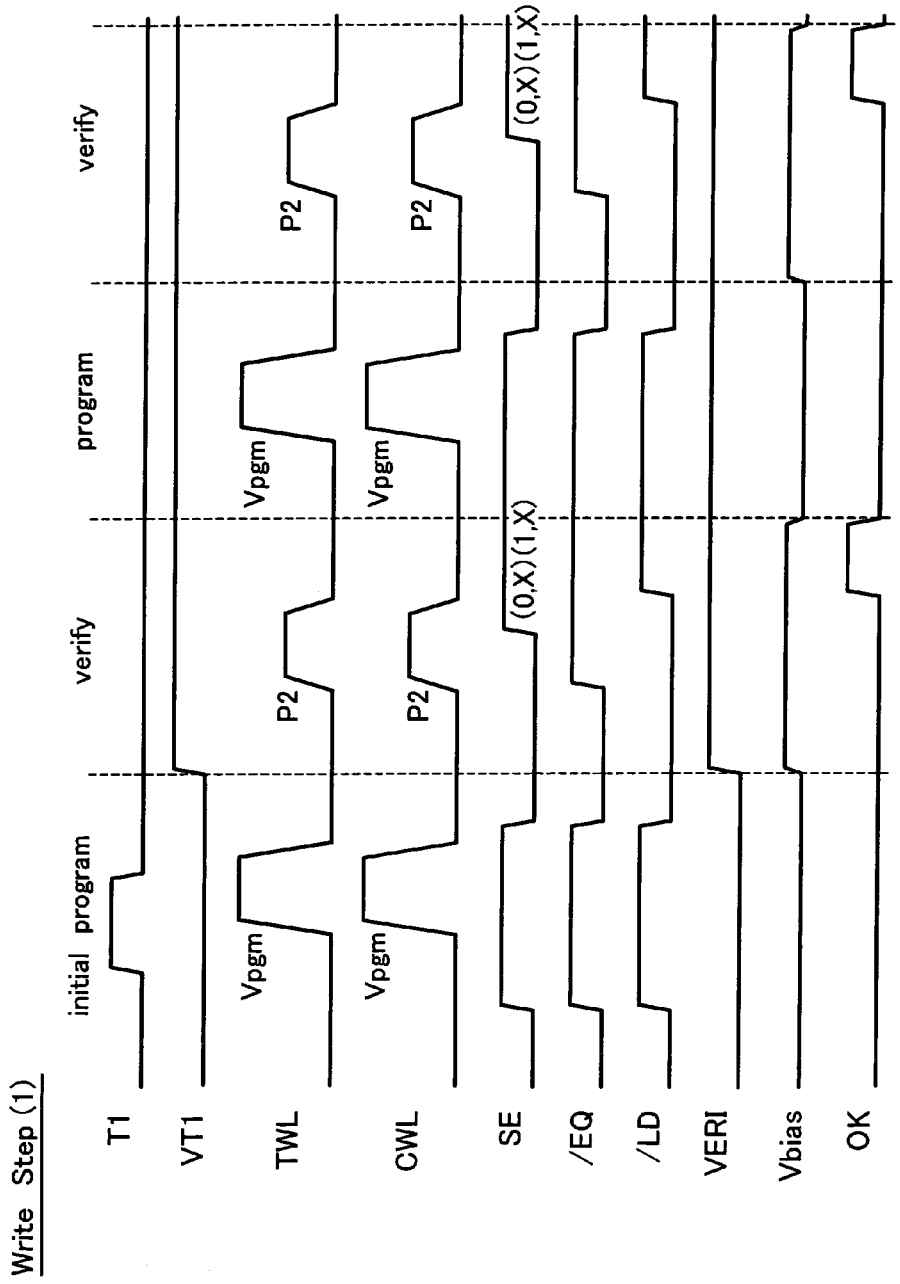
FIG. 12 is a timing chart of the write step (1) in the data write operation of the flash memory.
Figure 13:
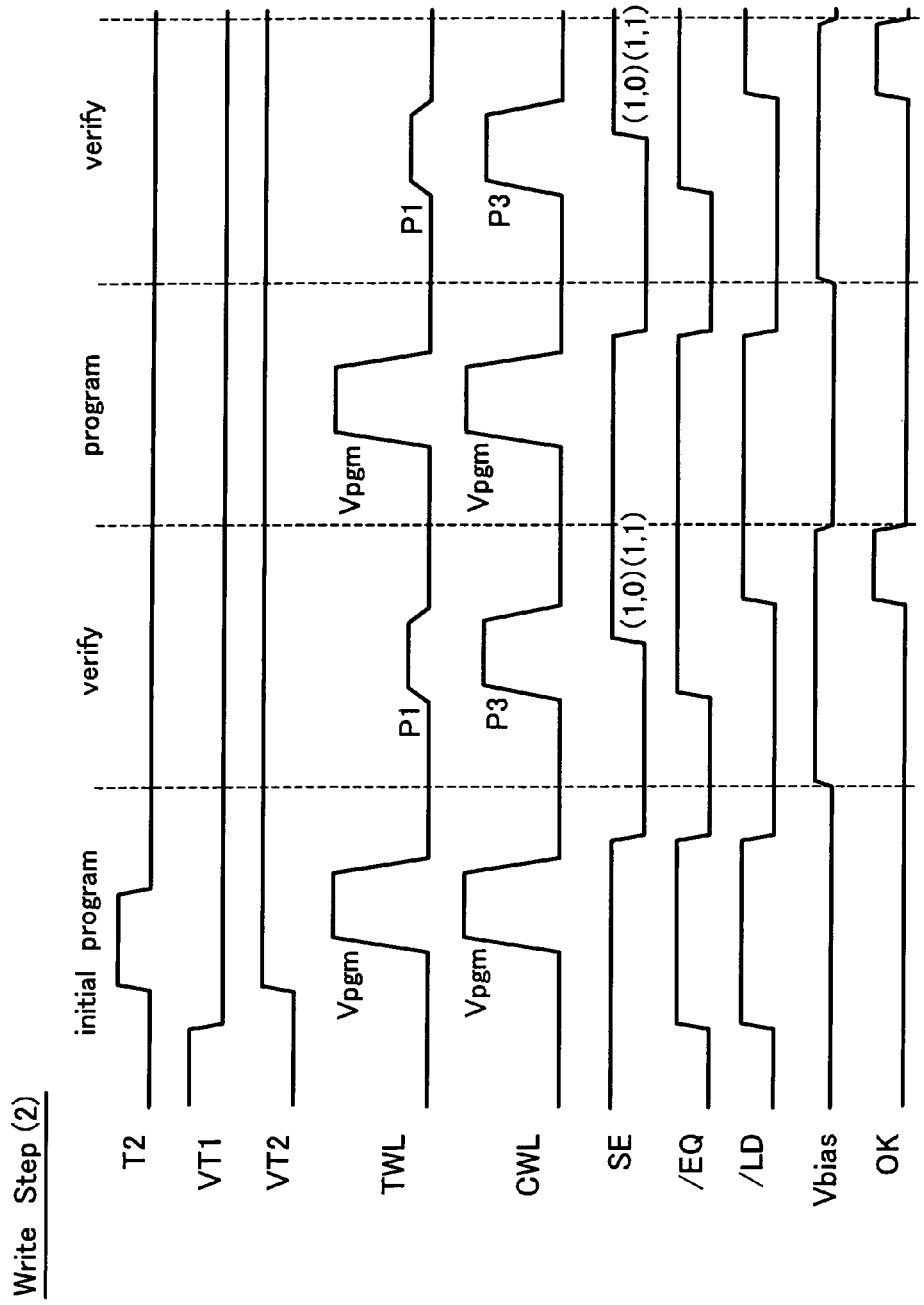
FIG. 13 is a timing chart of the write step (2) in the data write operation of the flash memory.
Figure 14:
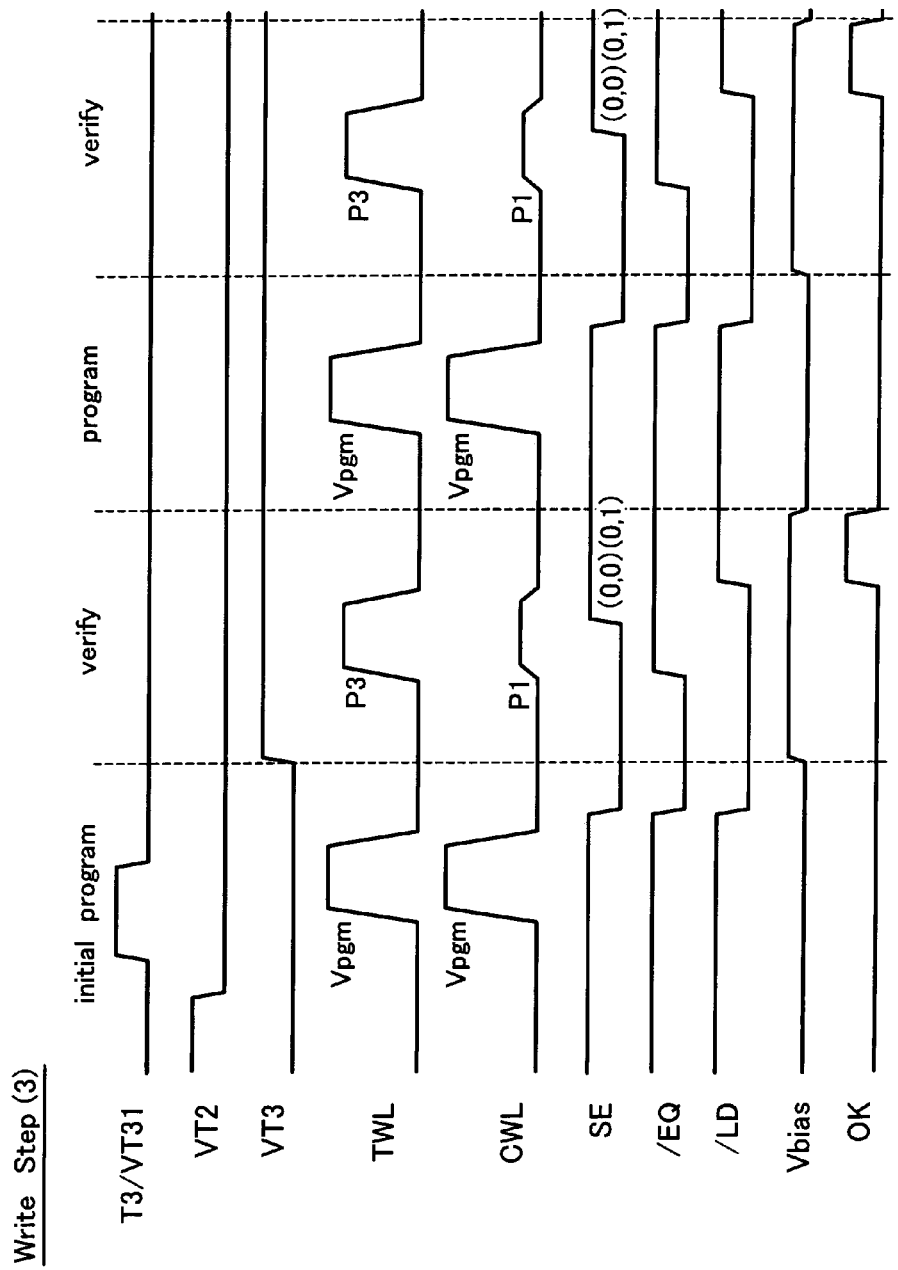
FIG. 14 is a timing chart of the write step (3) in the data write operation of the flash memory.

FIGS. 12 to 14 show timing diagrams for the above-described write steps (1), (2) and (3). By use of these timing charts, the write steps will be described in detail. As shown in the timing chart of FIG. 12, the write step (1) is preformed, after "initial write (program)", to repeat "verify" and "write (program)" until when it is judged that the write operations for all data have been completed. At the "initial program" step, the higher bit data held in the data latch 32a is transferred to the sense amplifier 31, and then the write operation starts for pair cells. Up to this step, the higher bit data of to-be-written 4-value data are transferred to the data latches 32a from the data bus DL. Data on the data bus DL will be reversed to the expected value of the read data in a logic level. That is, to-be-written data to be loaded from external are logic-inverted and transferred to the data bus DL.

Prior to the data transfer from the data latch 32a to the sense amplifier 31, sense nodes N3 and N4 are precharged and equalized to Vdd. Further, during control signal VERI is "L", NMOS transistors MN3 and MN4 are on to connect the sense nodes N3, N4 to the bit lines TBL, CBL. Therefore, bit lines TBL, CBL are also precharged to Vdd.

Prior to raising-up the timing signal T1, cancel the equalizing state (/EQ="H"), stop the precharging state (/LD="H"), and activate the sense amplifier 31 (SE="H"). Then, raise up the timing signal T1 to transfer the data held in data latch 32a to sense amplifier 31, and the data write operation starts. Data transferred to the sense amplifier 31, one of the sense nodes N3 and N4, and one of the bit lines TBL and CBL which is connected to the one of the sense nodes, are discharged corresponding to the transferred data. Then, apply write pulse voltage Vpgm to word lines TWL and CWL selected in the cell arrays 1t and 1c, and the write operation is performed. Only for cells each of which is connected to a bit line connected to a "L" level side node of the sense amplifier 31, electron injection into these floating gates occurs, whereby the threshold is going to increase. As above-described with FIG. 10, refer to plural bit line pairs, electron injection operations are simultaneously done for all selected pair-cells in such a manner as being done either for T-cell on the bit line TBL or for C-cell on the bit line CBL corresponding to data.

After the write pulse application operation is done for a predetermined time, the following "verify" operation is performed for verifying whether each cell has been written to have a desirable threshold voltage or not. For this verify operation, internal nodes of the sense amplifier are precharged/equalized again. In the following operations, the control signal VERI is set at "H", thereby causing the simultaneously driving sate of gates G1 and G2 being stopped. In place of this, gates G1 and G2 are controlled by the logic control circuits 35a and 35b so as to connect the bit lines TBL, CBL to sense amplifier 31 in such a manner that only one of bit lines TBL, CBL, which is subjected to a write operation in the narrow sense (i.e., electron injection operation), is connected to the sense amplifier 31. In detail, in this write step (1), timing signal VT1 becomes "H" to turn on NMOS transistors MN43 and MN44. As a result, corresponding to the higher bit data, HB, /HB, held in the data latch 32a, either one selected in NMOS transistors MN3 and MN4 becomes on. Further, control signal Vbias becomes "H" to cause the current source NMOS transistor MN0 to flow the reference current I0 for judging write completion.

Then, as having been described with FIG. 10, a verify-read operation is performed by applying verify-voltage P2 to the word lines TWL and CWL. A result of the verify-read performed by use of sense amplifier 31 under the above-described condition is as follows: for the cell(s) threshold of which has been sufficiently increased, one sense node connected to a bit line is not discharged, and the other sense node is discharged by the current source NMOS transistor MN0, whereby the data of sense amplifier will be inverted from the initially written state; and for the cell(s) threshold of which has not been sufficiently increased as determined in comparison with the reference current I0, data inverting will not occur. Note here, the current value of the reference current source is determined in consideration of what degree of cell current should be regarded as write completion in correspondence with the word line level in the verify-read. That is, this current value is a parameter determined in consideration of memory reliability margin and the like.

After the verify-read has been done, the following write operation is performed while the state of sense amplifier 31 is held as it is. If the data held in a sense amplifier 31 has been inverted in the above-described verify-read, sine then, the sense amplifier 31 is inhibited to perform precharge operation for precharging the bit line into 0V. In other word, the following write operation will be performed only for cells as being insufficiently written. For the insufficiently written cells, an additional electron injection operation is done by applying the write pulse voltage Vpgm to the selected word lines TWL, CWL, and then verify-read operation is performed. The verify-read and write operations are repeated until all sense amp data are inverted.

At each end of the verify-read operations, a write termination judging signal "OK" is supplied to the array of sense amplifiers 31 for judging whether data write has been completed or not for all sense amplifiers. The detail will be described later. Up to this, the threshold distribution according to the write step (1) is obtained as shown in FIG. 10.

At the write step (2) shown in FIG. 13, write and verify-write operations are performed for pair-cells each of which the higher bit HB="1" has already been written. As the write step (2) starts, timing signal VT1 becomes "L", in place of this, timing signal VT2 becomes "H". At the "initial write (program)", the lower bit of the data latch 32b is transferred to the sense amplifier 31, then write operation is started for pair-cells. Up to this step, to-be-written data are transferred to the data latches 32a from the data bus DL. As similar to the above-described higher bit write operation, data on the data bus DL will be reversed to the expected value of the read data in a logic level.

The sense amplifier 31 is maintained in a state decided by the write step (1). To this sense amplifier 31, data held in the data latch 32b is transferred by raising the timing signal T2. Note here, the transfer circuit 33 is controlled to transfer data to sense amplifier(s) 31 only where node N12 of the data latch 32a is "H" (i.e., /HB="H"). This is because of that this write step (2) is, as having been explained with FIG. 10, to write the lower bit into cell(s) higher bit HB of which is "1".

The timing signal VT2 becoming "H", NMOS transistors MN45 and MN52 become on in the logic control circuits 35a and 35b. Further, NMOS transistors MN48, MN55, which are disposed between MNOS transistors MN45, MN52 and terminals to which lower bit data LB, /LB ate supplied, are driven by /HB="H" to turn on. That is, in correspondence with the lower bit data LB, /LB held in the data latch 32b, either one of the gates G1 and G2 selectively becomes "H". Due to this, the write pulse voltage Vpgm applied to the selected word lines TWL, CWL, a write operation for the lower bit data is started. In detail, for cell(s) connected to a "L" level side node of the sense amplifier(s) 31, an electron injection operation will be done.

Sense amplifier circuit, in which the higher bit HB="0" is held, maintains the write completion state obtained by the write step (1). After the write pulse application operation has been done for a predetermined time, the "verify" operation follows for verifying whether each cell has been written to have a desirable threshold voltage or not. One of bit line pair, which is to perform electron injection, has already been connected to the sense amplifier 31. Therefore, raise up the signal Vbias to activate the current source 36, and one of bit line pair is connected to sense amplifier 31, and the other to the current source 36. To the selected word lines TWL, CWL, different verify voltages P1, P3 are applied, respectively, as shown in FIG. 10.

Cell threshold being sufficiently increased in this verify-read, one sense amp node connected to the bit line is not discharged, and the other discharged, whereby data of the sense amplifier will be inverted from the initially written data state. For the cell(s) threshold of which has not been sufficiently increased as determined in comparison with the reference current I0, data inverting will not occur.

After the verify-read has been finished, the following "write" operation is performed while the state of sense amplifier 31 is held as it is. That is, for such cells that are insufficiently written, an additional electron injection operation is done by applying the write pulse voltage Vpgm to the selected word lines TWL, CWL, and then verify-read operation is performed. The verify-read and write operations are repeated until all sense amp data in this write step (2) are inverted. The write step (2) completed, data "10" and "11" shown in FIG. 10 are decided. After each the verify-read operation, the write completion judging signal "OK" is supplied to the array of sense amplifiers 31 for judging whether data write have been completed or not for all sense amplifiers. This is the same as the write step (1).

At the write step (3) shown in FIG. 14, write and verify operations are performed for pair-cells each of which the higher bit HB="0" has been written. As the write step (3) starts, timing signal VT2 becomes "L". At the "initial write (program)", the lower bit of the data latch 32b is transferred to the sense amplifier 31, then write operation is started for pair-cells. In detail, timing signal T3 raised up, the lower bit data transfer is performed to only sense amplifier(s) 31 as being in a state where node N11 of the data latch 32a is "H"

(i.e., HB="H"). Simultaneously, let the timing signal VT31 be "H", and NMOS transistors MN41, MN42 turn on in the logic control circuits 35a, 35b so as to control the gates G1, G2 corresponding to the lower bit data LB, /LB, whereby one of the MNOS transistors MN3 and MN4 turns on.

More specifically, one of the bit line pair is connected to the sense node corresponding to the lower bit data, whereby it becomes to be able to write the lower bit data. The sense amplifier, in which the higher bit data "1" is held, maintains the connection state obtained by the write step (2), i.e., write completion state. In the above-described state, apply the write pulse voltage Vpgm to the word lines TWL, CWL connected to the pair cells to be written, and an electron injection operation will be done to increase the threshold for only cell(s) on the bit line(s) connected to "L" level side node of the sense amplifier(s) 31.

After the write pulse application operation has been done for a predetermined time, the "verify" operation follows for verifying whether each cell has been written to have a desirable threshold voltage or not. Hereinafter, timing signal VT3 becomes "H". As a result, the logic control circuits 35a, 35b control the MNOS transistors MN3, MN4 as follows: for a pair-cell with the higher bit HB is "0" and the lower bit LB is to be "0", bit line TBL on the T-cell side is connected the sense amplifier 31; and for a pair-cell with the higher bit HB is "0" and the lower bit LB is to be "1", bit line CBL on the C-cell side is connected to the sense amplifier 31.

Then, verify-read operation is performed by letting the control signal Vbias be "H" to activate the current source NMOS transistor MN0, and by applying the verify-voltages P1, P3 to the selected word lines TWL, CWL, respectively. Cell threshold being sufficiently increased, one sense amp node connected to the bit line is not discharged, and the other is discharged by the reference current source. Therefore, data of the sense amplifier with the higher bit HB as being "0" will be inverted from the initially written data state.

The sense amplifier with the higher bit as being "1" is connected to a bit line cell on which has been written to have a sufficiently high threshold, thereby being decided as a write completion state. After the verify-read has been finished, the following write operation is performed while the state of sense amplifier 31 is held as it is. That is, for cells that are insufficiently written, an additional electron injection operation is done. Such the verify-read and write operations are repeated until all sense amp data in this write step (3) are inverted. The write step (3) completed, data "00" and "01" shown in FIG. 10 are decided. After each the verify-read operation, the write completion judging signal "OK" is supplied to the array of sense amplifiers 31 for judging whether data write have been completed or not for all sense amplifiers. This is the same as the write steps (1) and (2).

Figure 15:
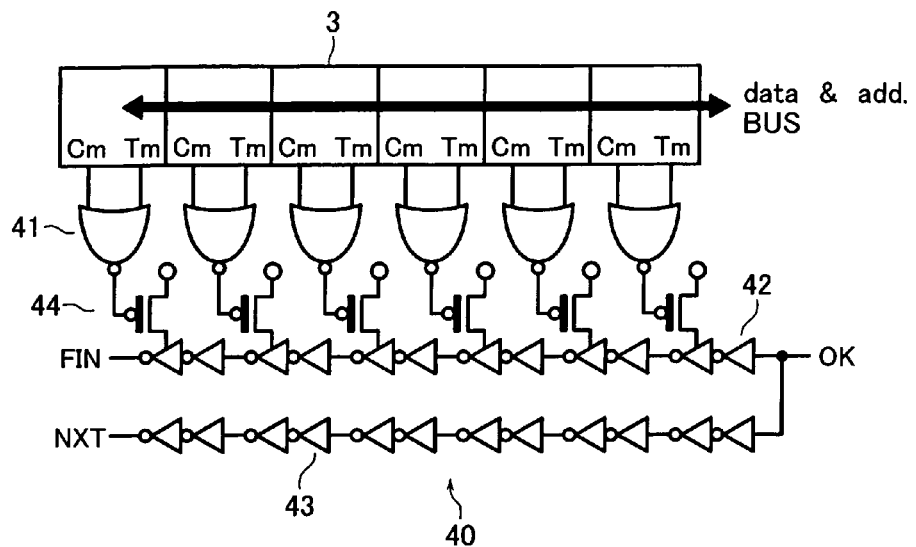
FIG. 15 shows a configuration of the write finish judgment circuit of the flash memory.

A write end judging circuit with the judging signal "OK" and operation thereof will next be described in detail. FIG. 15 shows a configuration of the write end judging circuit 40 connected to the sense amplifier circuit 3. In the sense amplifier circuit 3, as shown in FIG. 9, write end monitor nodes Tm, Cm are disposed. As write completion has been verified in the write-verify read, either one of these monitor nodes Tm, Cm becomes "H".

In the end judging circuit 40, a NOR gate array 41 is disposed. To two inputs of each NOR gate, the monitor nodes Tm and Cm of each sense amplifier are connected. Further disposed is an inverter chain 42 including inverters with power switches driven by the respective outputs of the NOR gate array 41. To the input terminal of the inverter chain 41, the judge-use signal OK is input. As data write have been completed in all sense amplifiers to cause the monitor node Tm or Cm be "H", the judge-use signal OK passes through the inverter chain 42 to output a finish signal FIN.

In the end judging circuit 40, another inverter chain 43 is disposed to share the input terminal with the inverter chain 42. This inverter chain 43 outputs a timing signal NXT at each timing when the judging signal OK is input. Using the timing signal NXT together with the finish signal FIN generated synchronously with the timing signal NXT, it becomes possible to control for finishing the write cycles so as to go to the next step.

Next, a serial transferring/outputting operation for the read out data will be described in a case that the above-described data read operation is to read out one-page cell data in parallel. If serial access is done in order from the uppermost address as similar to the ordinary one, the higher bit HB read out to the data latch 32a is output prior to the lower bit LB. As above-described, 4-value data is expressed as "XY" with the higher and lower bits X and Y. It should be noted that there is a fear of 4-value data erroneously becoming to be "YX" depending on the read out order of the higher and lower bits and the combination of these bit data.

The bit lines of cell array being arranged with about a minimum device-feature size, it is difficult to dispose the sense amplifiers at bit line pitch. In consideration of this point, in a practical case, sense amplifiers are disposed in a manner as each being commonly used for plural bit lines. In this case, each group of bit lines simultaneously selected in the plural bit lines and sharing a sense amplifier is defined as a column bank. These column banks are schematically configured as shown in FIG. 16.

The column banks are constituted by the complementary cell arrays it, 1c as shown in FIG. 1. FIG. 16 shows a case in which the cell arrays it, 1c constitute to eight column banks CB0 to CB7. Data latches in the plural sense amplifiers commonly used for these column banks are shown as being divided into a group 51 of the higher bit-use data latches (HBL) 32a and another group 52 of the lower bit-use data latches (LBL) 32b. For these data latch groups 51, 52, serial access is performed, as shown by an arrow A, in such a manner as to sequentially access in the HBL group 51, and next sequentially access in the LBL group 52. The serial access for a column bank is ended by one round of the above-described accesses. Thereafter, return to the front of the HBL group 51 as shown by an arrow B, and the following column bank is serially accessed as similar to the above-described accessing.

To be possible to continuously perform serial accesses without breaks for the entire column banks CB0 to CB7, it is necessary for controlling bank address selection, and for controlling timings between the serial output operation and the read out operation from the cell array. In detail, the following method may be used: during serial outputting for read data held in the LBL group 52 after serial outputting for the HBL group 51 has been finished for the column bank CB0, perform data read from cells to the HBL group 51 for the higher bit of the following column bank CB1; and then, during serial outputting for read data held in the HBL group 51 for the column bank CB1, perform data read from cells to the LBL group 52 for the lower bit of the same column bank CB1. By repeating the above-described sequence control, the serial output of the read out data is continuously done without breaks.

Figure 16:
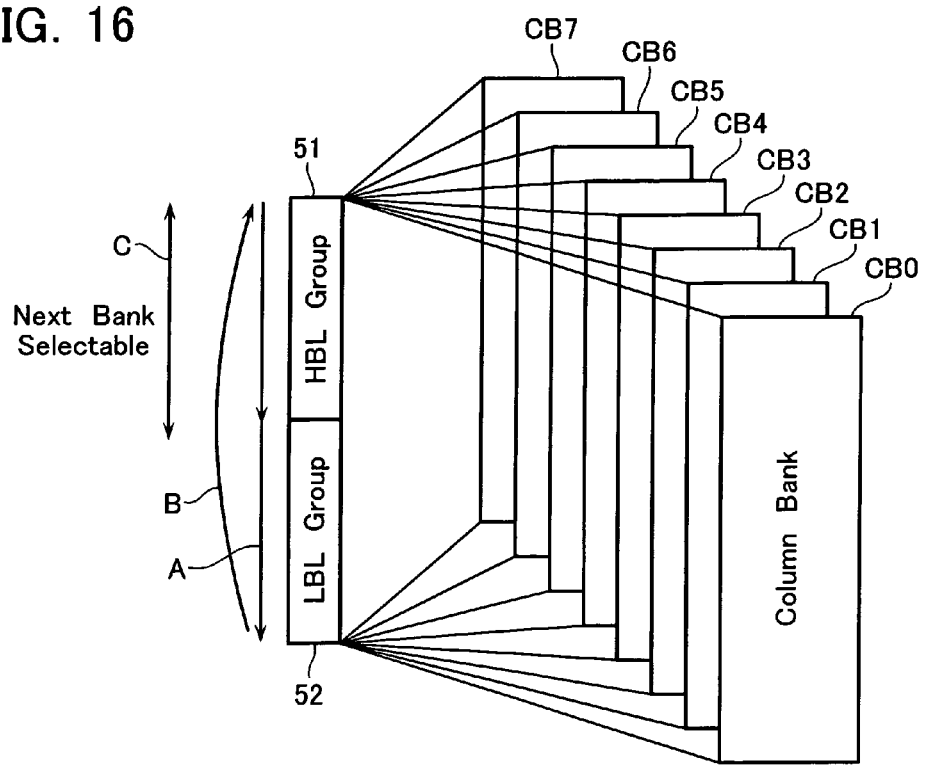
FIG. 16 shows a bank configuration of the flash memory.

An arrow C shown in FIG. 16 designates a timing range in which the following column bank is selectable during a serial output operation for a column bank. That is, select the following column bank during serial accessing for the HBL group 51, and dada read of the cell array may be performed without breaking the sequential serial accessing. If column selecting is done outside of the timing range C, data read from the bit lines to the HBL group 51 is not completed during serial outputting the data held in the LBL group 52, whereby timing gaps may be occur in the sequential serial accessing.

Figure 17:
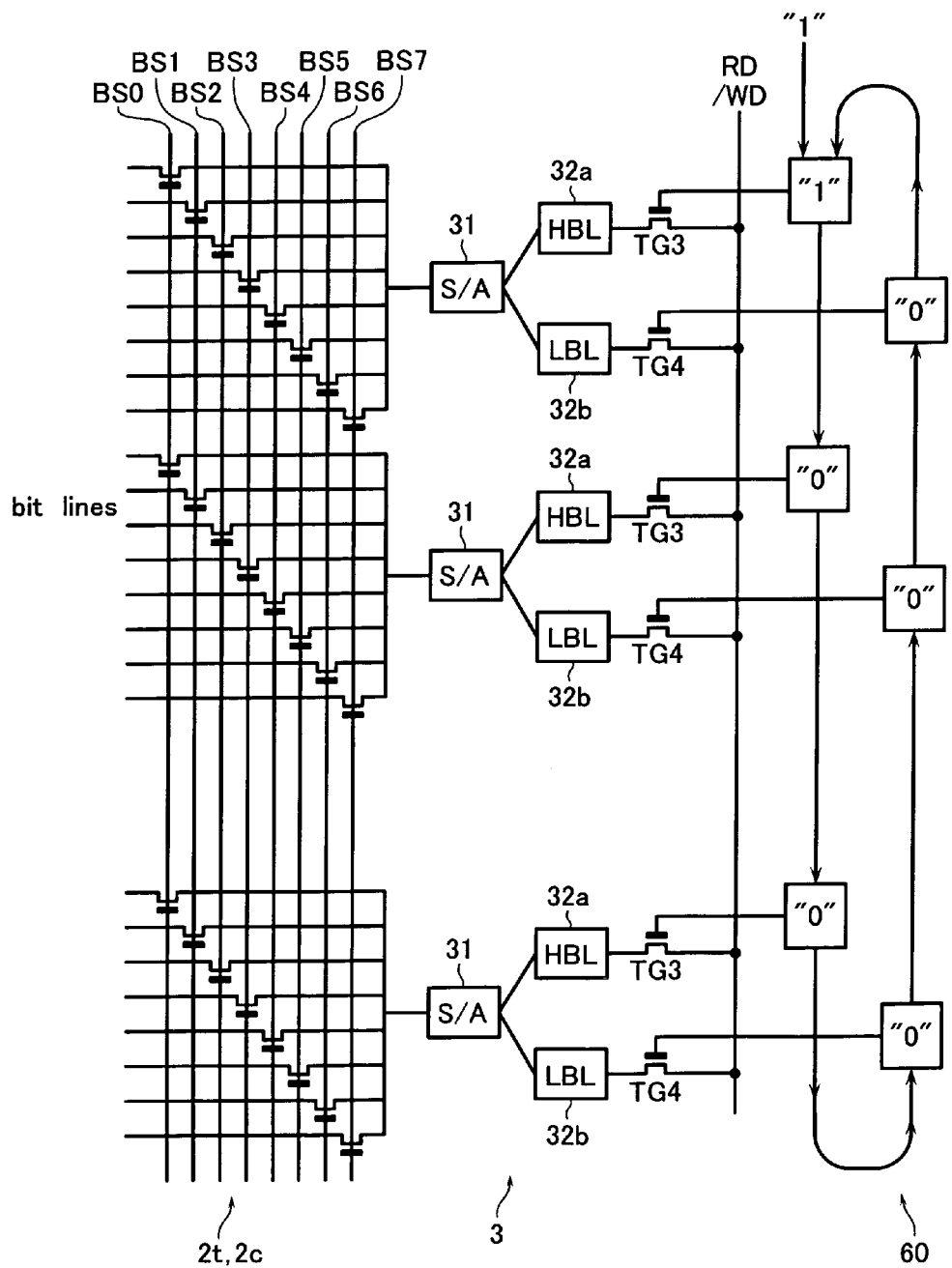
FIG. 17 shows a configuration of the transfer control circuit for serially outputting the read data from the memory cell array.

FIG. 17 shows the configuration shown in FIG. 16 in detail. In this figure, for simplifying the explanation, one pair of bit lines is shown by one straight line. Although column gate circuits 2t, 2c are practically disposed for the respective cell arrays 1t, 1c as shown in FIG. 1, these are shown as being united in this figure. Although only one data line RD (/WD) is shown, complementary data lines are practically disposed as shown in FIG. 9. To select eight column banks CB0 to CB7 shown in FIG. 16, bank select lines BS0 to BS7 are disposed.

To control the transfer gates TG3, TG4 disposed between the HBL 32a, LBL 32b in the sense amplifier circuit 3 and the dada tine RD (/WD) so as to perform serial data outputting, a shift register 60 is used for serving as a transfer control circuit. The shift register 60 is connected to form a ring. Set "1" into a start register, and the data "1" is sequentially shifted. Therefore, on receipt of "1" output from each stage in the shift register 60, the transfer gates TG3 of the HBL group are sequentially driven, and next the transfer gates TG4 of the LBL group are sequentially driven. As a result, HBLs 32a are sequentially connected to the data line RD (/WD), and next LBLs 32b are sequentially connected to the data line RD (/WD).

Another approach for controlling serial access of the transfer gates TG3, TG4 is to dispose an address bus, address decoder for driving it, address counter and the like. However, in this scheme, load capacitance of the address decoder becomes large. Therefore, in consideration of achieving high-speed performance and low power consumption, the above-described serial transfer control scheme with a shift register is preferable.

As described above, in the NAND-type flash memory according to this embodiment, a multi-value data storage scheme and a pair-cell scheme in which two cells constitute a pair-cell for storing complementary data therein are used. Therefore, it is able to obtain as high data density as the ordinary NAND-type flash memory. In addition, a current sensing-type differential sense amplifier is used to sense data by comparing two cell currents for a pair-cell. Due to this, it is possible to perform high-speed data sense without flowing large current as being flowed in the ordinary NOR-type flash memory. Further, it is not necessary to increase the cell size for achieving high-speed performance, thereby being possible to maintain the feature of the ordinary NAND-type flash memory as the unit cell area is small.

Next, an electric card using the flash memory according to the above-described embodiment and an electric device using the card will be described bellow.

Figure 18:
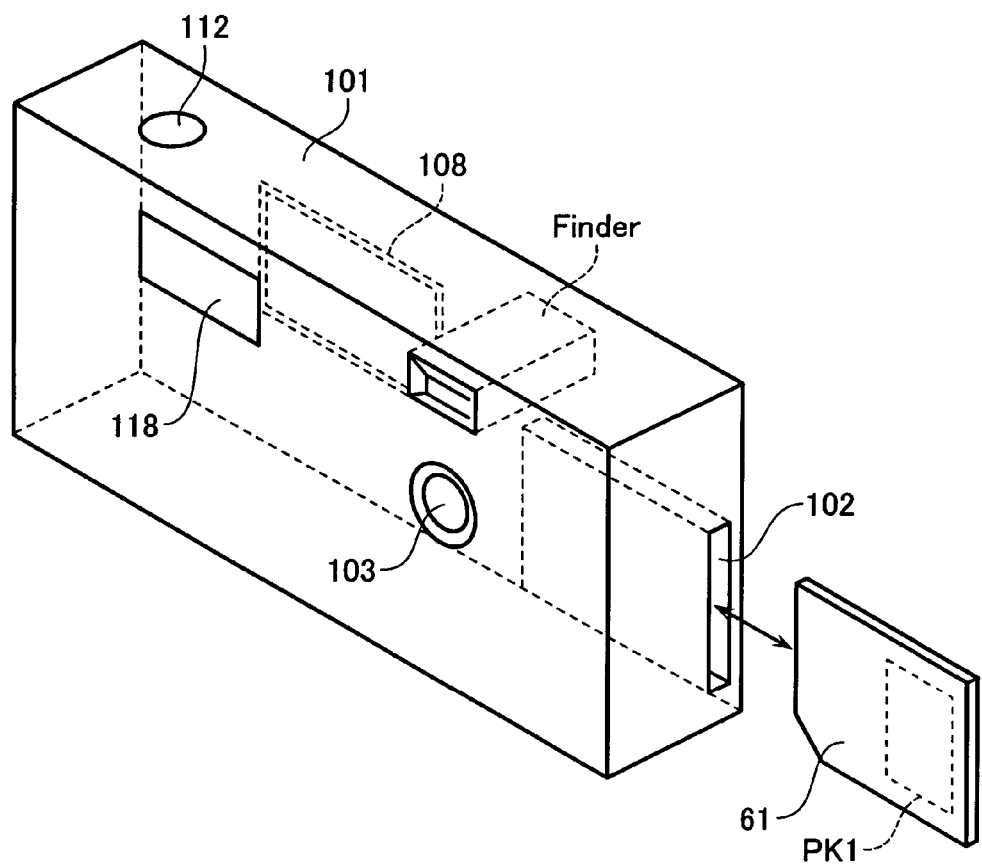
FIG. 18 shows another embodiment applied to a digital still camera.

FIG. 18 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 19:
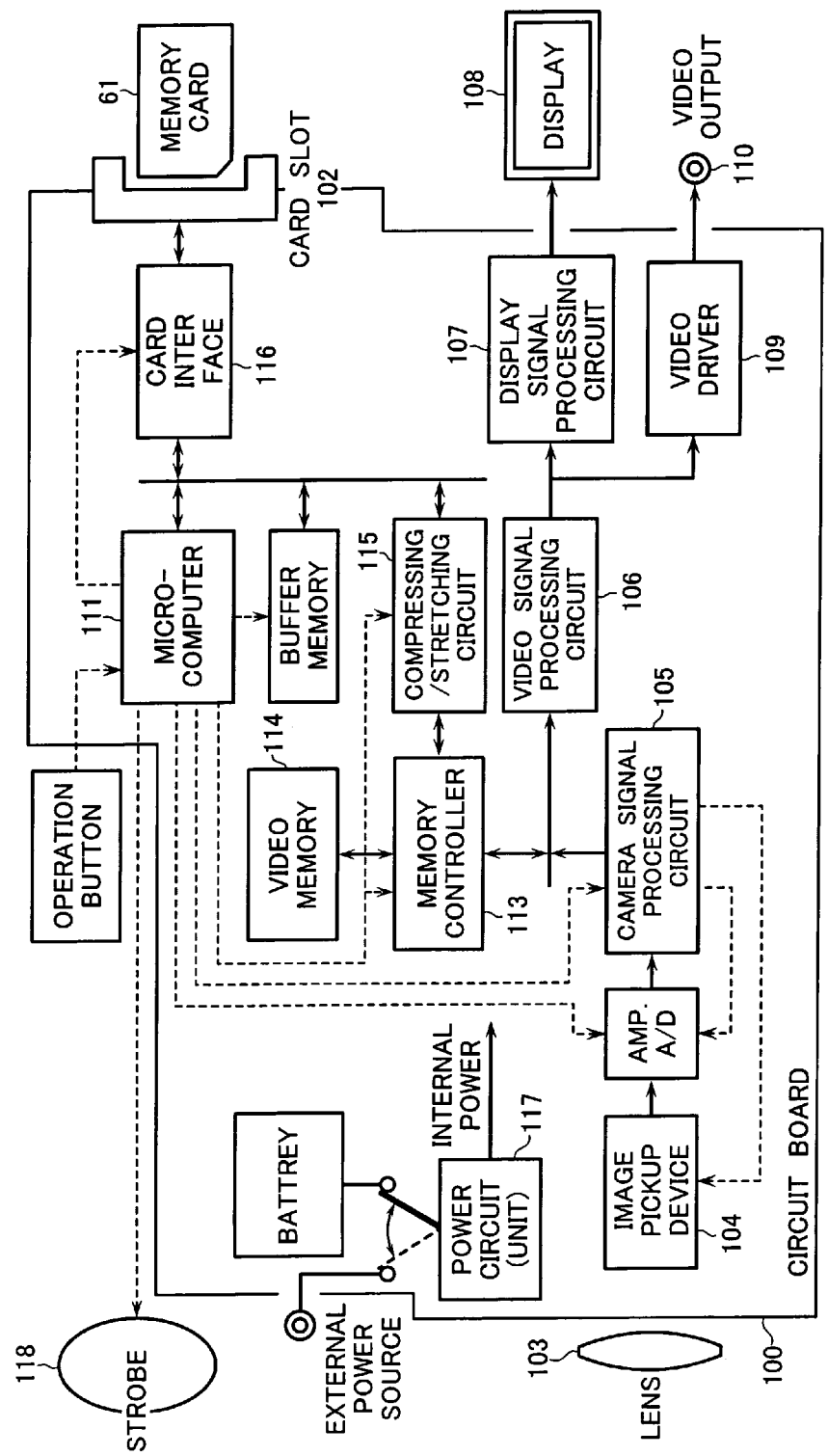
FIG. 19 shows an internal configuration of the digital camera.
Figure 20A:
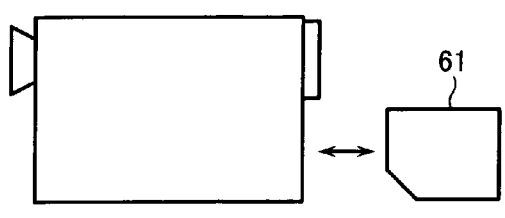
FIGS. 20A to 20J show other electric devices to which the embodiment is applied.
Figure 20F:
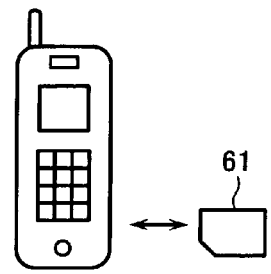
Figure 20B:
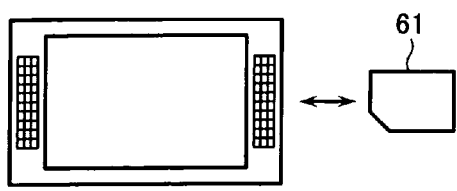
Figure 20G:
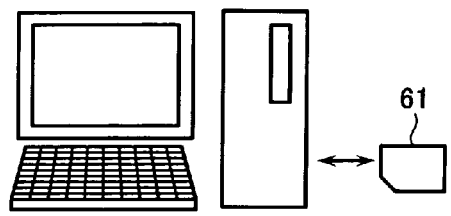
Figure 20C:
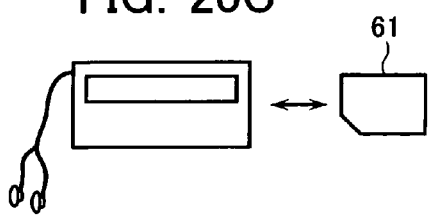
Figure 20H:
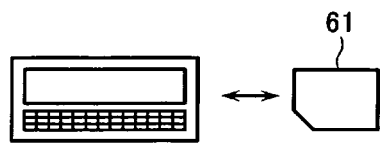
Figure 20D:
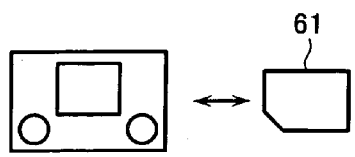
Figure 20I:
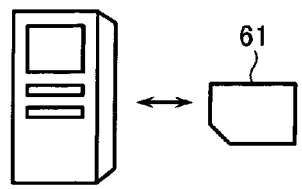
Figure 20E:
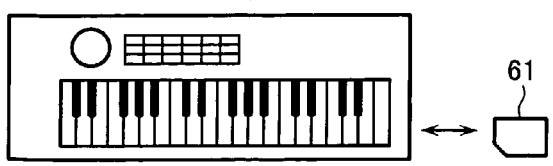
Figure 20J:
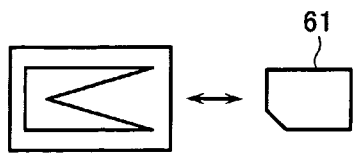

FIG. 19 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC—DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 20A to 20J, as well as in portable electric devices. That is, the electric card can also be used in a video camera shown in FIG. 20A, a television set shown in FIG. 20B, an audio apparatus shown in FIG. 20C, a game apparatus shown in FIG. 20D, an electric musical instrument shown in FIG. 20E, a cell phone shown in FIG. 20F, a personal computer shown in FIG. 20G, a personal digital assistant (PDA) shown in FIG. 20H, a voice recorder shown in FIG. 20I, and a PC card shown in FIG. 20J.

The aforementioned embodiments are merely examples and hence do not restrict the present invention. Although a NAND-type flash memory device has been explained in the above-described embodiments, the present invention is applicable to, for example, a NOR-type, DINOR-type, and the like non-volatile semiconductor memory devices.

What is claimed is:

1. A non-volatile semiconductor memory device comprising:
    a memory cell array in which a plurality of electrically rewritable and non-volatile memory cells are arranged; and
    a sense amplifier circuit configured to read data of said memory cell array, wherein
    first and second memory cells selected simultaneously in said memory cell array constitute a pair-cell for storing multi-value data, the multi-value data being defined by a combination of different threshold levels of the first and second memory cells, and wherein
    said sense amplifier circuit detects a difference between cell currents of the first and second memory cells to sense data of the pair-cell.

2. The non-volatile semiconductor memory device according to claim 1, wherein
    said memory call array comprises:
    first and second cell arrays disposed to sandwich said sense amplifier circuit;
    first and second word lines disposed in the first and second cell arrays, respectively, each pair of the first and second word lines being simultaneously activated; and
    first and second bit lines disposed in the first and second cell arrays, respectively, each pair of the first and second bit lines being selected simultaneously, and wherein
    the first and second memory cells constituting the pair-cell are disposed in the first and second cell arrays, respectively, to be selected by a pair of bit lines and a pair of word lines.

3. The non-volatile semiconductor memory device according to claim 2, wherein
    the multi-value data is 4-value data defined by a combination of different threshold levels of said first and second memory cells in four threshold levels, and wherein
    said sense amplifier circuit comprises:
    a plurality of differential sense amplifiers each having two sense nodes connected to the first and second bit lines via select gates respectively to detect a difference of cell currents of the first and second bit lines in a data read mode, and apply a voltage to the first and second bit lines corresponding to a to-be-written data in a data write mode;
    a plurality of first data latches in each of which a higher bit of read out 4-value data in each said differential sense amplifier is transferred and held, and a higher bit of 4-value data externally supplied is loaded; and
    a plurality of second data latches in each of which a lower bit of said read out 4-value data in each said differential sense amplifier is transferred and held, and a lower bit of said 4-value data externally supplied is loaded.

4. The non-volatile semiconductor memory device according to claim 3, wherein each said differential sense amplifier comprises:
    a CMOS flip-flop having PMOS transistors, sources of which are connected to said sense nodes, and NMOS transistors disposed between drains of said PMOS transistors and a reference terminal; and
    current source loads connected to said sense nodes.

5. The non-volatile semiconductor memory device according claim 3, wherein
    said sense amplifier circuit further comprises transfer circuits each driven by timing signals to control data transferring between each said differential sense amplifier and the corresponding first and second data latches.

6. The non-volatile semiconductor memory device according to claim 5, wherein each said transfer circuit comprises:
    a first transfer gate driven by a first timing signal to connect said differential sense amplifier to said first data latch; and
    a second transfer gate driven by a second timing signal and a first data state of a higher bit held in said first data latch to connect said differential sense amplifier to said second data latch; and
    a third transfer gate driven by a third timing signal and a second data state of a higher bit held in said first data latch to connect said differential sense amplifier to said second data latch.

7. The non-volatile semiconductor memory device according to claim 3, wherein
    said sense amplifier circuit further comprises reference current source circuits each disposed for said differential sense amplifier to be selectively connected to one of said two sense nodes during a verify-read in a data write cycle, thereby inverting data held in said differential sense amplifier in response to a result of said verify-read.

8. The non-volatile semiconductor memory device according to claim 3, wherein
    said sense amplifier circuit further comprises logic control circuits each disposed for said differential sense amplifier for controlling said select gates so as to connect one of said sense nodes to one of the pair of bit lines based on timing signals and the data held in said first and second data latches.

9. The non-volatile semiconductor memory device according to claim 1, wherein
    said memory cell array comprises a plurality of NAND cell units, each NAND cell unit comprising plural memory cells connected in series, one end of which is connected to a bit line via a first select transistor and the other end to a source line via a second select transistor.

10. The non-volatile semiconductor memory device according to claim 1, wherein
the multi-value data is 4-value data defined by a combination of different threshold levels of said first and second memory cells in four threshold levels.

11. The non-volatile semiconductor memory device according to claim 10, wherein
said four threshold levels are expressed as L0, L1, L2 and L3 (where, L0<L1<L2<L3), and said 4-value data is expressed as "XY" (where, X and Y are higher and lower bits, respectively), said pair-cell storing one data state selected in data "11" defined by said first and second memory cells being set at levels L0 and L3 respectively, data "10" defined by said first and second memory cells being set at levels L1 and L2 respectively, data "01" defined by said first and second memory cells being set at levels L2 and L1 respectively, and data "00" defined by said first and second memory cells being set at levels L3 and L0 respectively.

12. The non-volatile semiconductor memory device according to claim 11, further comprising a controller for controlling data read and write operations, wherein a data write mode controlled by the controller, after having initialized all to-be-written pair-cells at the level L0, includes performing the steps of:
simultaneously writing data into said all to-be-written pair-cells in a state that second memory cells of pair-cells which are to store X=1 are set at level L2, and first memory cells of pair-cells which are to store X=0 are set at level L2;
simultaneously writing data into pair-cells which are to store X=1 in a state that said first memory cells which are to store Y=0 are set at level L1, and said second memory cells which are to store Y=1 are set at level L3; and
simultaneously writing data into pair-cells which are to store X=0 in a state that said first memory cells which are to store Y=0 are set at level L3, and said second memory cells which are to store Y=1 are set at level L1.

13. The non-volatile semiconductor memory device according to claim 12, wherein a data read mode controlled by the controller includes performing the steps of:
a first read step for sensing whether each said higher bit X is "0" or "1" to transfer the sensed higher bits X to the respective first data latches;
a second read step controlled by said higher bits X held in said first data latches to sense whether each said lower bit Y is "0" or "1" for pair-cells which store X=0, and transfer the sensed lower bits Y to the respective second data latches; and
a third read step controlled by said higher bits X held in said first data latches to sense whether each said lower bit Y is "0" or "1" for pair-cells which store X=1, and transfer the sensed lower bits Y to the respective second data latches.

14. The non-volatile semiconductor memory device according to claim 13, wherein
said first read step comprising reading out higher bits X of selected pair-cells by applying a first read voltage between said threshold levels L1 and L2 to first and second memory cells in selected pair-cells;
said second read step comprising reading out lower bits Y of pair-cells which store X=0 by applying a second read voltage between said threshold levels L2 and L3 to first memory cells therein and a third read voltage between said threshold levels L0 and L1 to second memory cells therein; and
said third read step comprising reading out lower bits Y of pair-cells which store X=1 by applying said third read voltage to first memory cells therein and said second read voltage to second memory cells therein.

15. The non-volatile semiconductor memory device according to claim 13, wherein
read out higher bits in said first data latches are serially output during said second and third read steps; and
read out lower bits in said second data latches are serially output during said first data read step.

16. The non-volatile semiconductor memory device according to claim 15, further comprising a shift register configured to perform access control so as to continuously and serially output the higher and lower bits read out to said first and second data latches.

17. An electric card equipped with a non-volatile semiconductor memory device, said non-volatile semiconductor memory device comprising:
a memory cell array in which a plurality of electrically rewritable and non-volatile memory cells are arranged; and
a sense amplifier circuit configured to read data of said memory cell array, wherein
first and second memory cells selected simultaneously in said memory cell array constitute a pair-cell for storing multi-value data, the multi-value data being defined by a combination of different threshold levels of the first and second memory cells, and wherein
said sense amplifier circuit detects a difference between cell currents of the first and second memory cells to sense data of the pair-cell.

18. An electric device comprising:
a card interface;
a card slot connected to said card interface; and
an electric card defined in claim 17 to be electrically connectable to said card slot.

* * * * *